(12) United States Patent
Tokranov et al.

(10) Patent No.: US 12,532,514 B2
(45) Date of Patent: Jan. 20, 2026

(54) SEMICONDUCTOR STRUCTURE WITH ISOLATION REGION INCLUDING COMBINATION OF DEEP AND SHALLOW TRENCH ISOLATION STRUCTURES AND METHOD

(71) Applicant: GlobalFoundries U.S. Inc., Malta, NY (US)

(72) Inventors: Anton V. Tokranov, Halfmoon, NY (US); James P. Mazza, Saratoga Springs, NY (US); Eric Scott Kozarsky, Gansevoort, NY (US); Elizabeth A. Strehlow, Cleveland, GA (US); Vitor A. Vulcano Rossi, Saratoga Springs, NY (US); Hong Yu, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 395 days.

(21) Appl. No.: 18/182,926

(22) Filed: Mar. 13, 2023

(65) Prior Publication Data
US 2024/0313113 A1    Sep. 19, 2024

(51) Int. Cl.
| | |
|---|---|
| *H10D 30/69* | (2025.01) |
| *H01L 21/762* | (2006.01) |
| *H10D 30/01* | (2025.01) |
| *H10D 30/62* | (2025.01) |

(52) U.S. Cl.
CPC ..... *H10D 30/795* (2025.01); *H01L 21/76229* (2013.01); *H10D 30/024* (2025.01); *H10D 30/6211* (2025.01)

(58) Field of Classification Search
CPC ............... H10D 30/795; H10D 30/024; H10D 30/6211; H10D 84/0158; H01L 21/76229
See application file for complete search history.

(56) References Cited

U.S. PATENT DOCUMENTS

| | | | |
|---|---|---|---|
| 9,564,486 B2 | 2/2017 | Akarvardar et al. | |
| 9,647,066 B2 | 5/2017 | Lu et al. | |
| 10,079,279 B2 * | 9/2018 | Song | H01L 21/76224 |
| 11,205,648 B2 | 12/2021 | Tokranov et al. | |

(Continued)

*Primary Examiner* — Bac H Au
(74) *Attorney, Agent, or Firm* — Francois Pagette; Hoffman Warnick LLC

(57) ABSTRACT

Disclosed is a semiconductor structure and method of forming the semiconductor structure. Specifically, the semiconductor structure can include a first semiconductor fin extending from a semiconductor substrate. The semiconductor structure can further include an isolation region on the semiconductor substrate adjacent to a lower portion of the first semiconductor fin. The first semiconductor fin can, for example, be incorporated into a single-fin fin-type semiconductor device, such as a single-fin fin-type field effect transistor (FINFET). The isolation region can include at least one shallow trench isolation (STI) structure positioned laterally between and immediately adjacent to sections of a deep trench isolation (DTI) structure. With this alternating DTI-STI-DTI configuration, overall shrinkage of isolation material of the isolation region during anneals is reduced and, thus, so are stress-induced crystalline defects in the first semiconductor fin. Also disclosed are methods for forming such a semiconductor structure.

18 Claims, 27 Drawing Sheets

(56) References Cited

U.S. PATENT DOCUMENTS

| | | | |
|---|---|---|---|
| 11,276,651 B2 | 3/2022 | Tokranov et al. | |
| 11,302,535 B2 | 4/2022 | Tsai et al. | |
| 11,742,347 B2* | 8/2023 | Liaw | H10D 84/0151 |
| | | | 257/288 |
| 12,136,627 B2* | 11/2024 | Chuang | H01L 21/76264 |
| 12,237,416 B2* | 2/2025 | Wang | H10D 84/038 |
| 2015/0145065 A1 | 5/2015 | Kanakasabapathy et al. | |
| 2016/0351565 A1* | 12/2016 | Sung | H10D 84/834 |
| 2018/0350801 A1* | 12/2018 | Chen | H10D 64/017 |
| 2019/0371891 A1* | 12/2019 | Goktepeli | H01L 21/30625 |
| 2019/0393220 A1* | 12/2019 | Na | H10D 84/038 |
| 2020/0105612 A1* | 4/2020 | Lin | H10D 64/015 |
| 2020/0235204 A1* | 7/2020 | Cheng | H10D 84/038 |
| 2021/0098309 A1* | 4/2021 | Min | H10D 84/834 |
| 2021/0167059 A1* | 6/2021 | Lee | H10D 62/121 |
| 2021/0327764 A1* | 10/2021 | Lin | H01L 21/0228 |
| 2023/0326799 A1* | 10/2023 | More | H10D 30/024 |
| | | | 257/384 |

\* cited by examiner

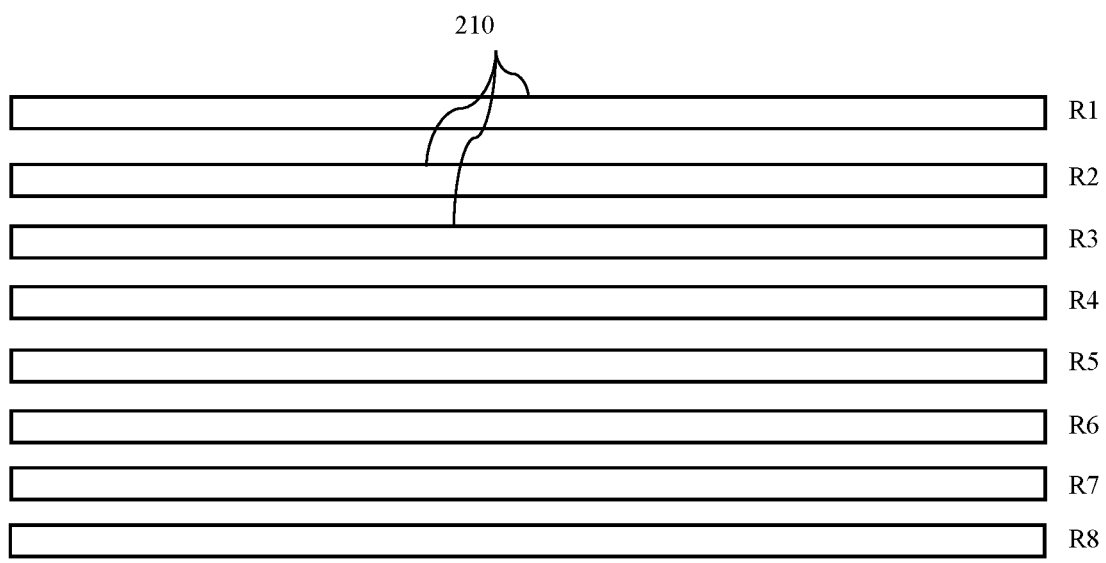
FIG. 3.1

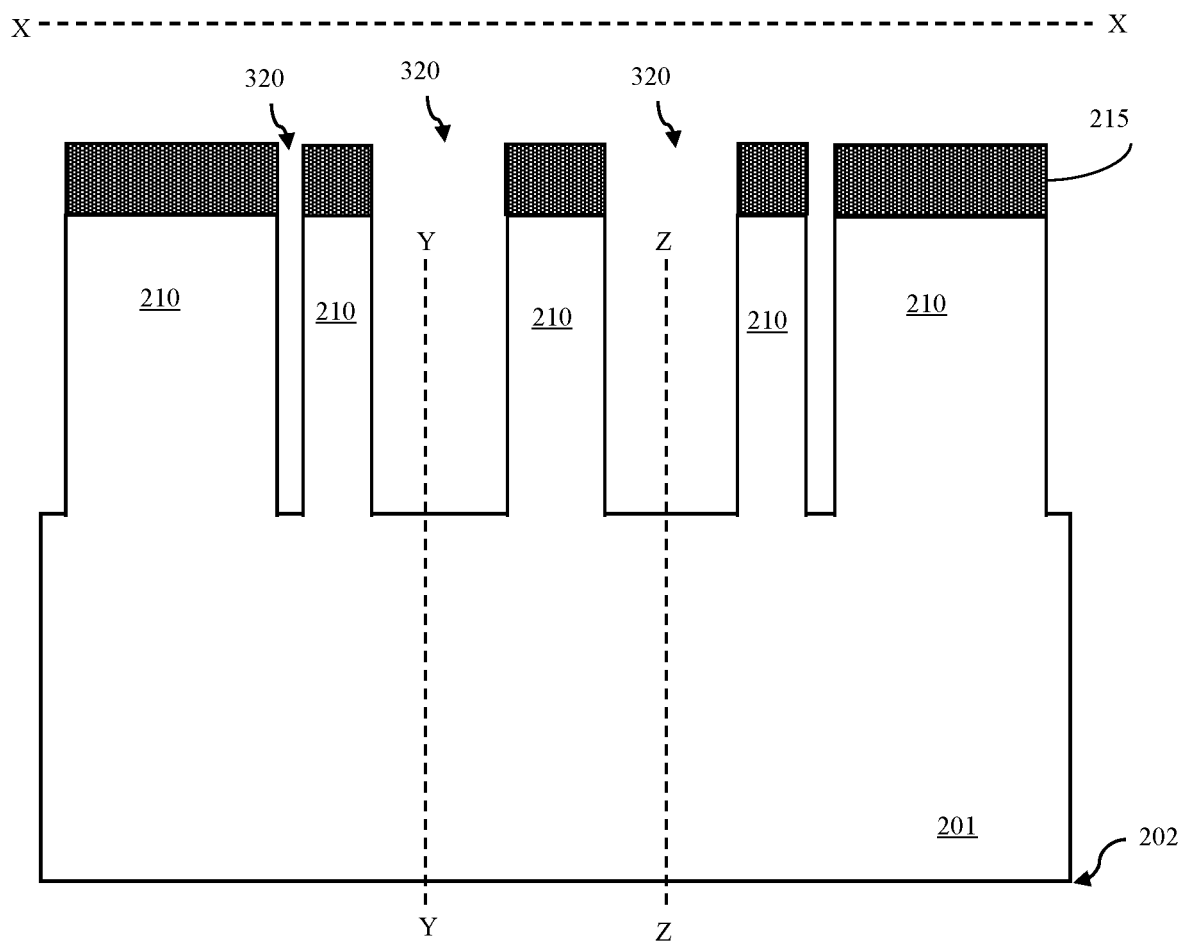
FIG. 3.2A

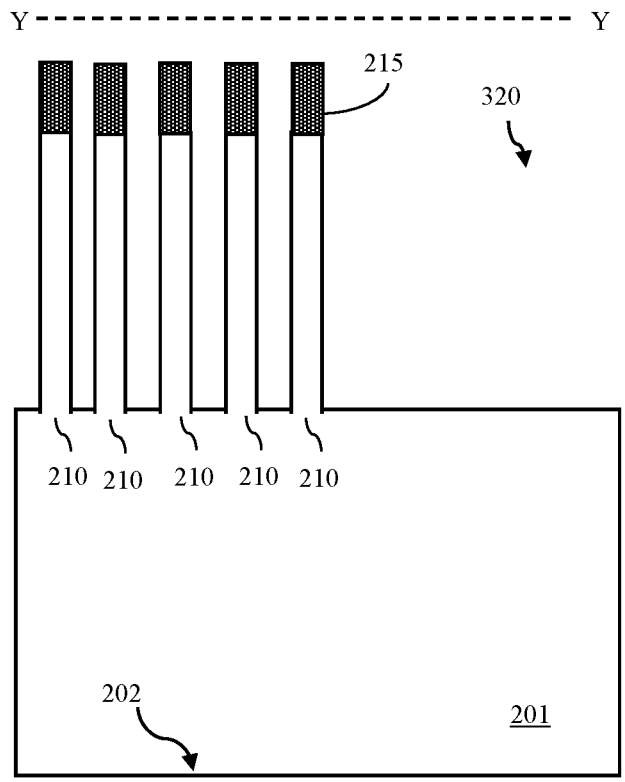
FIG. 3.2B
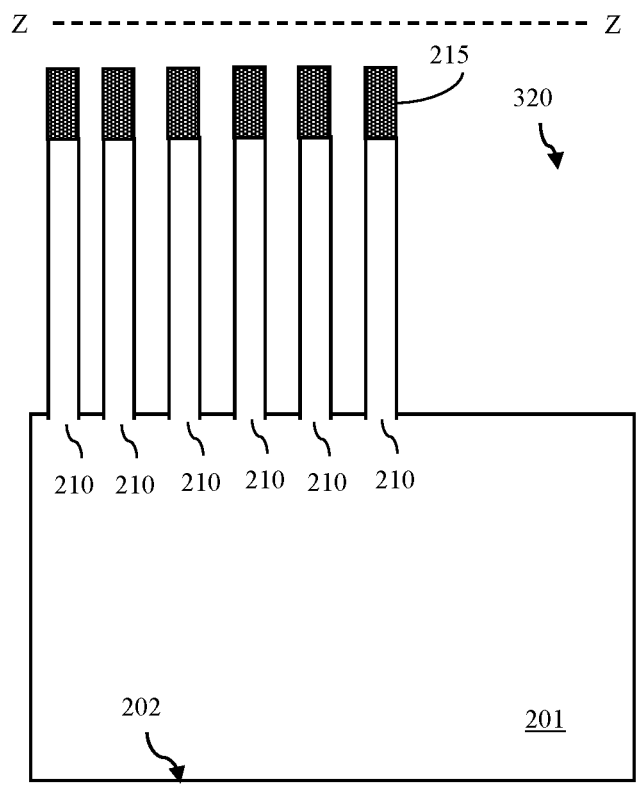
FIG. 3.2C

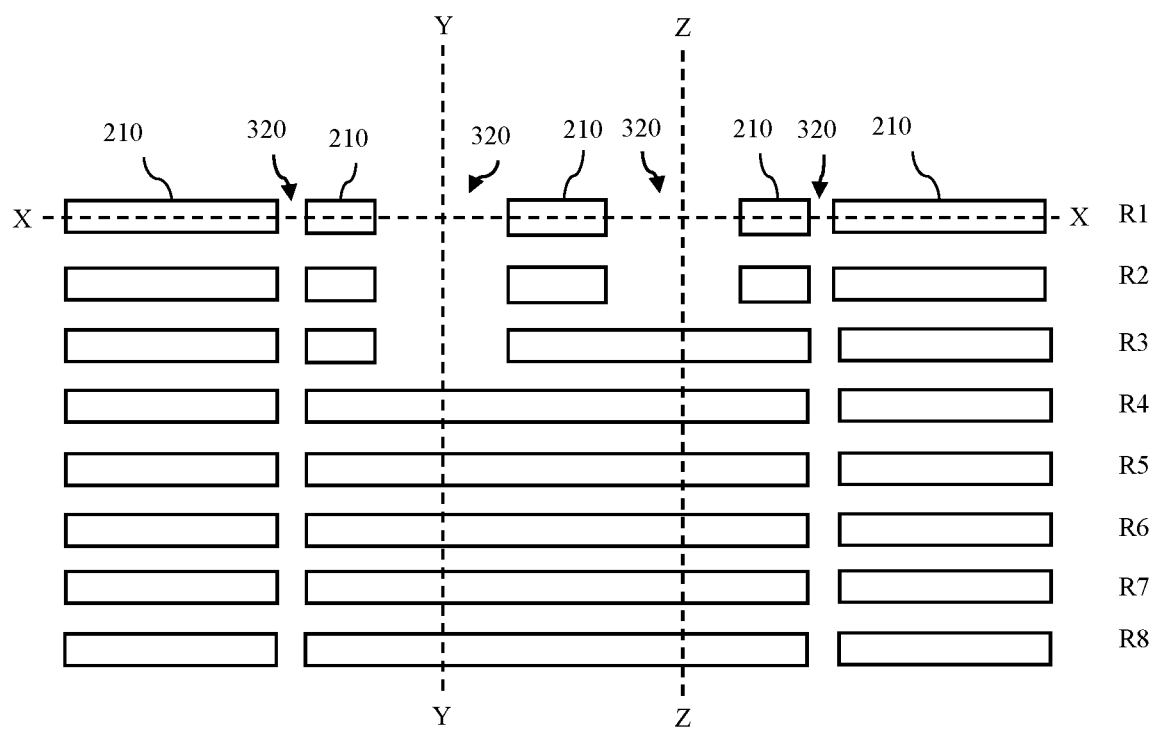
FIG. 3.2D

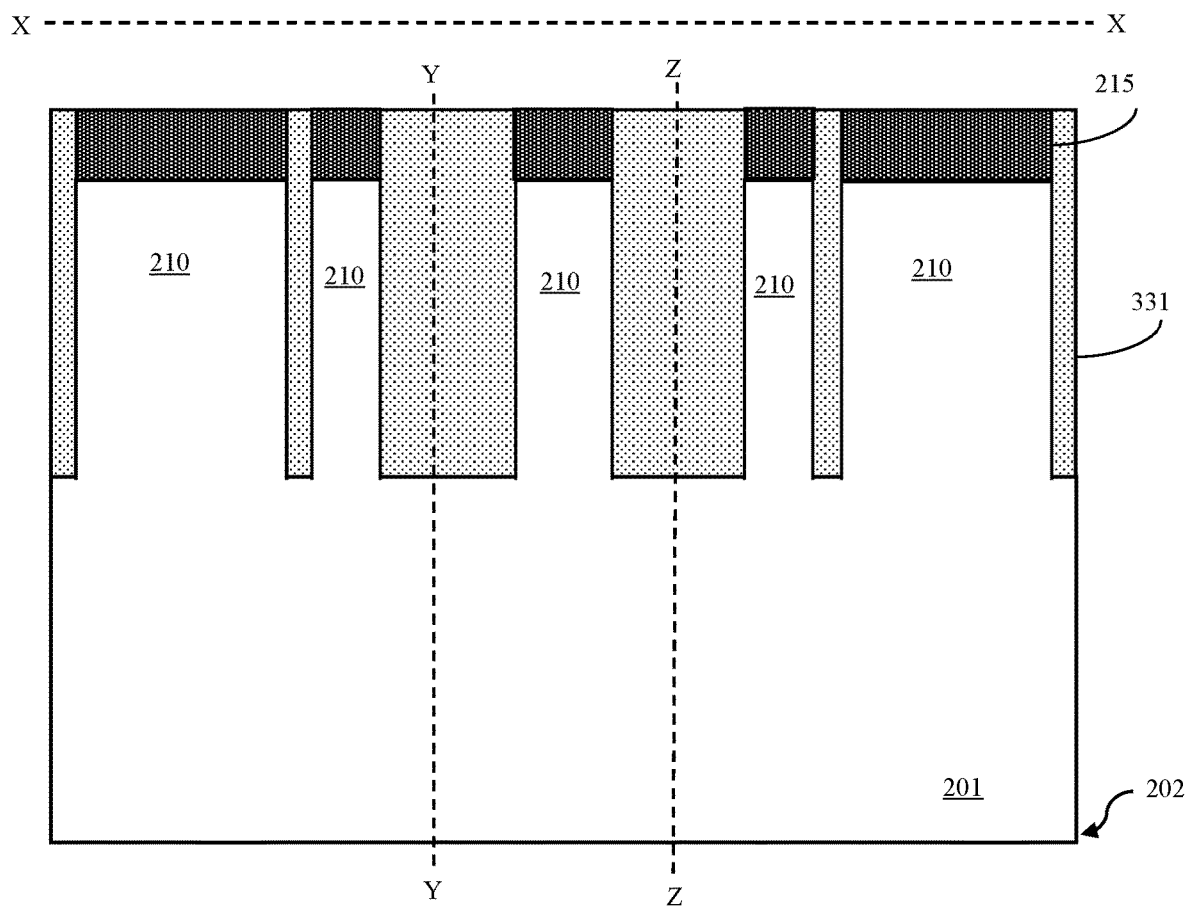
FIG. 3.3A

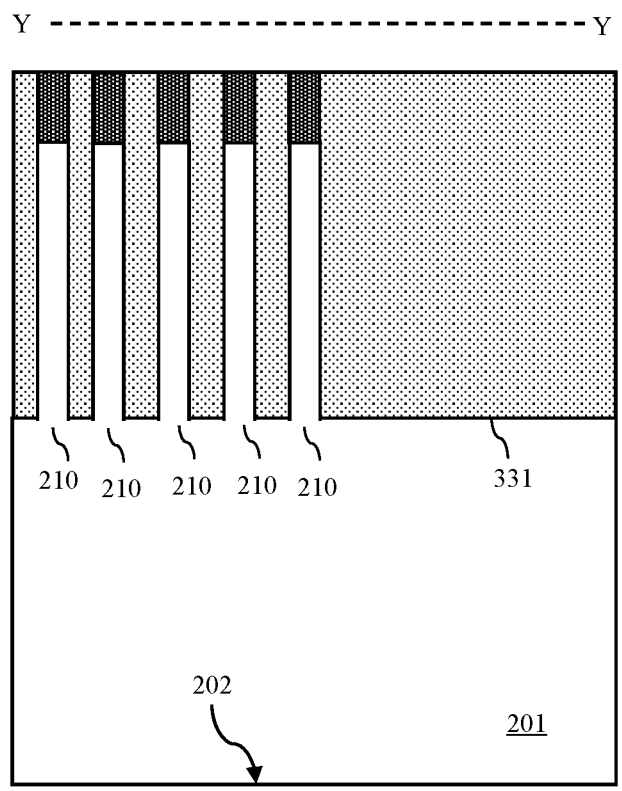
FIG. 3.3B
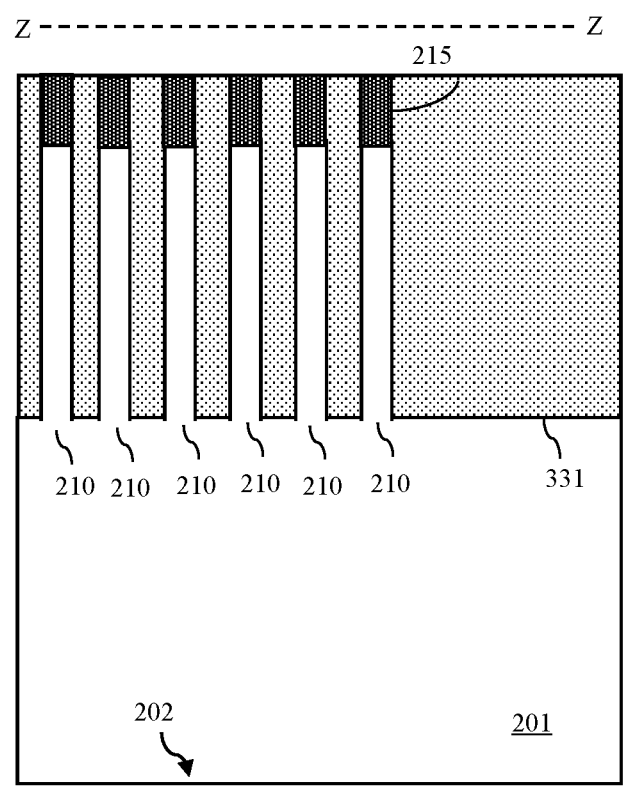
FIG. 3.3C

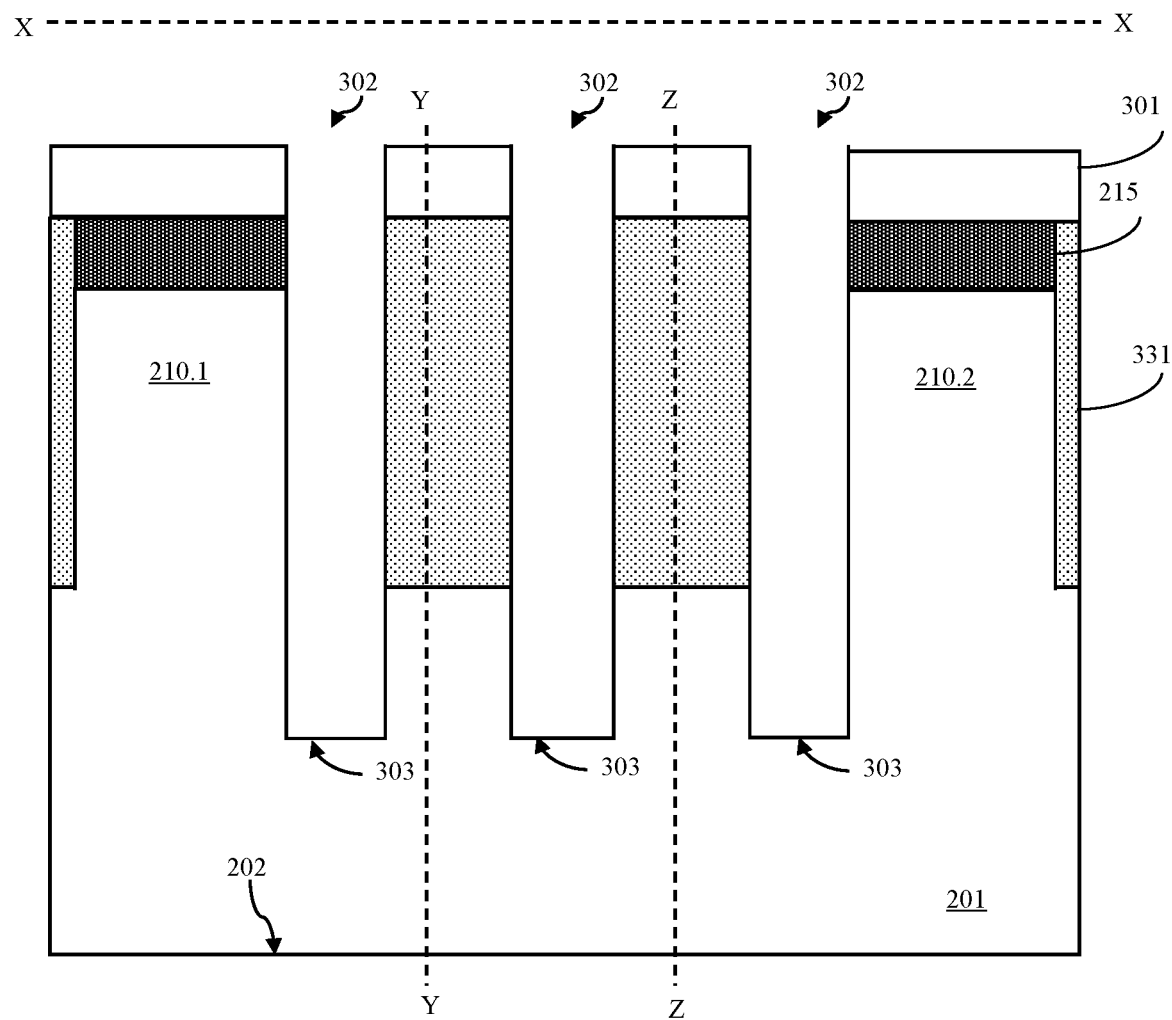
FIG. 3.4A

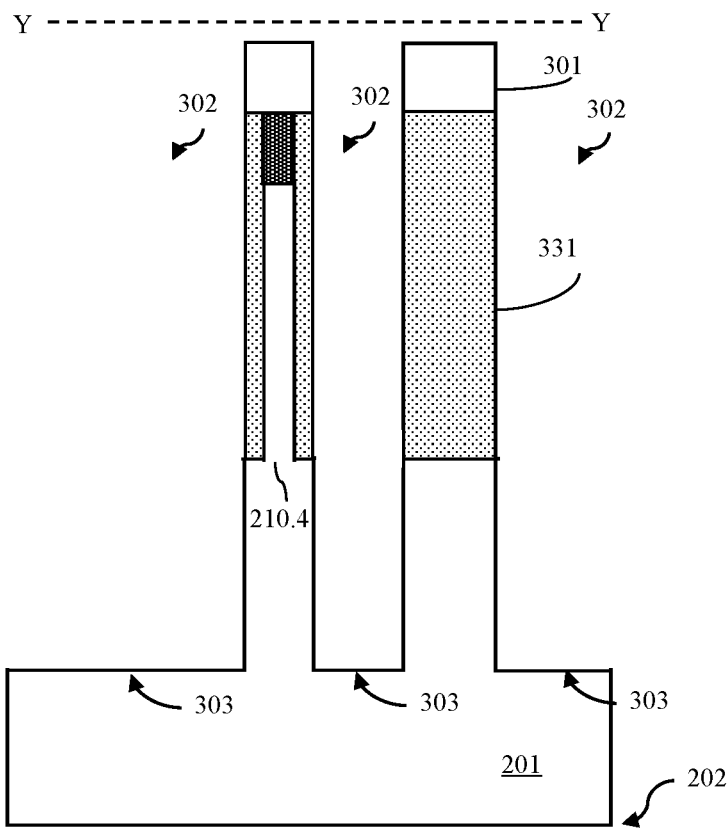
FIG. 3.4B
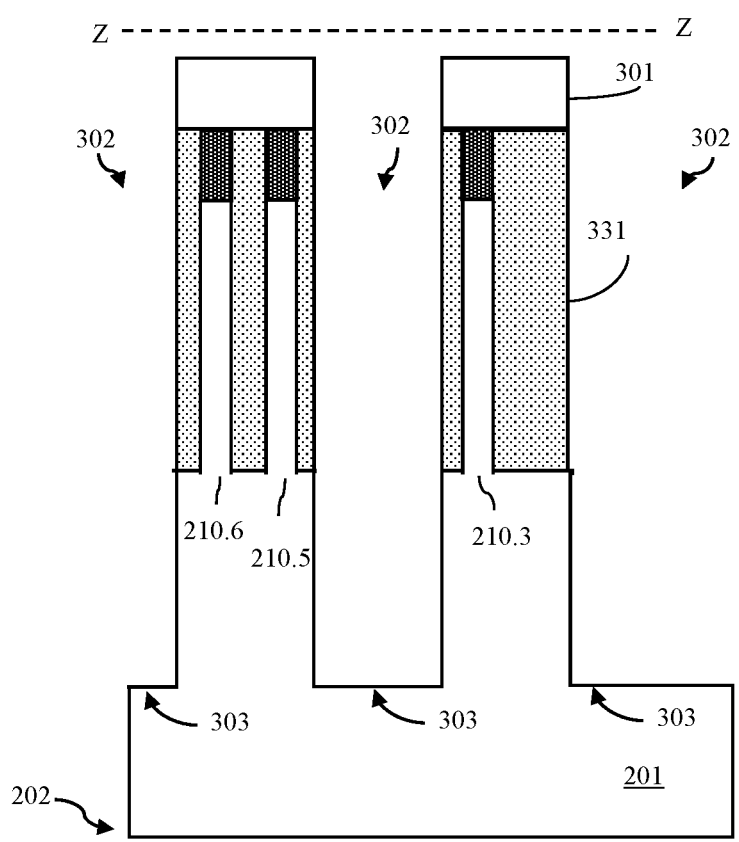
FIG. 3.4C

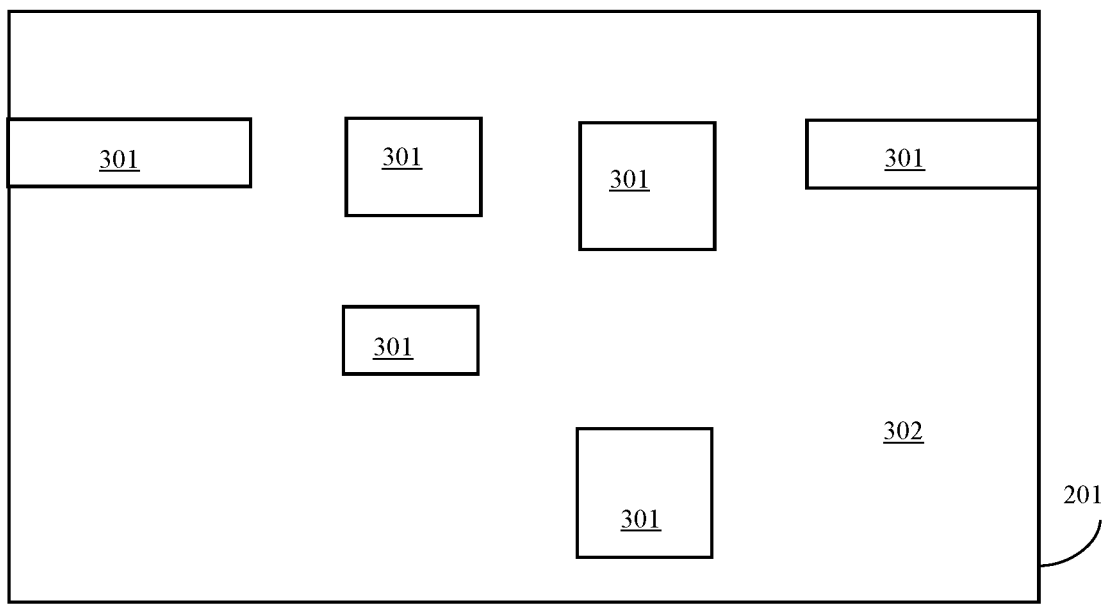
FIG. 3.4D

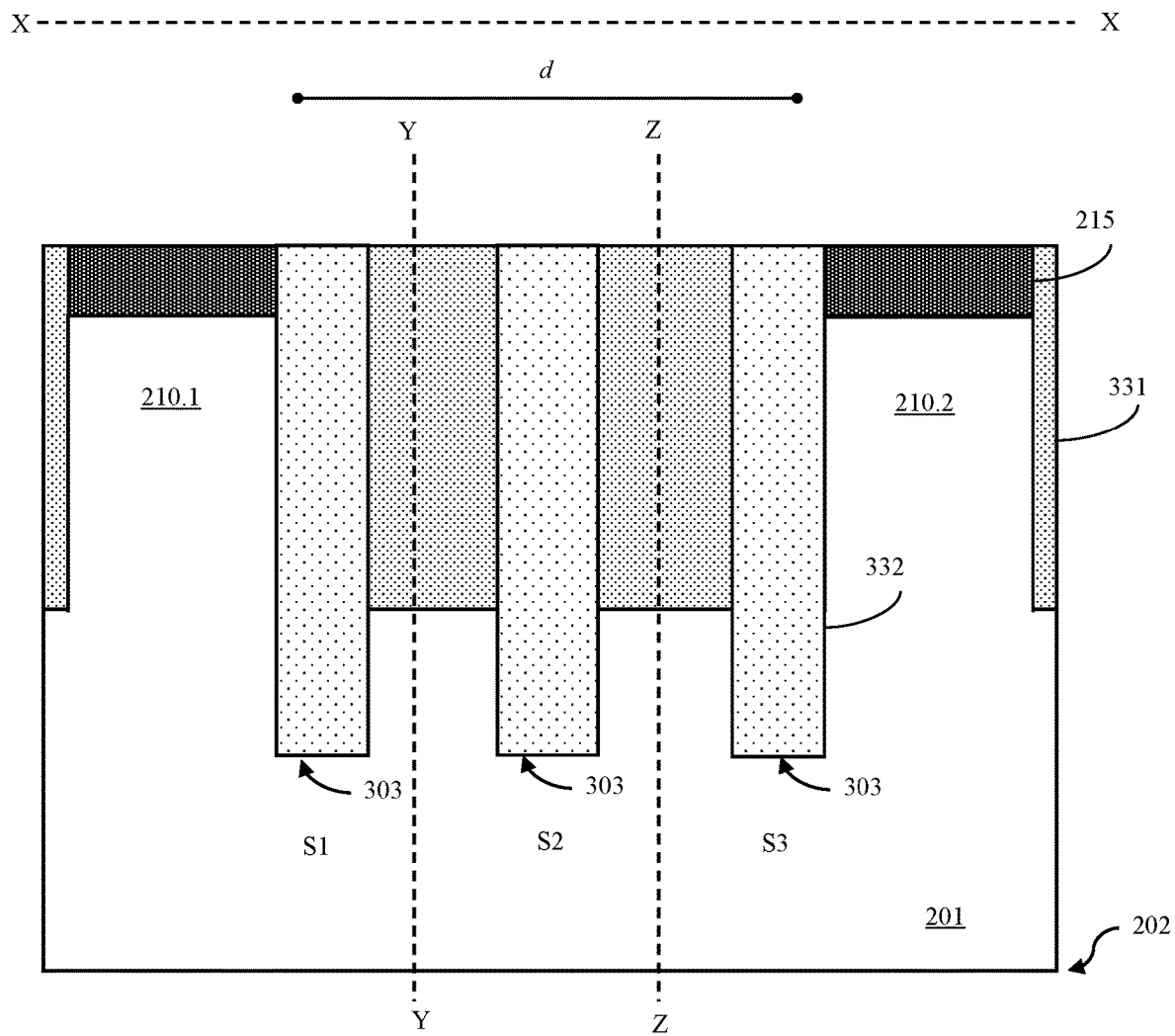
FIG. 3.5A

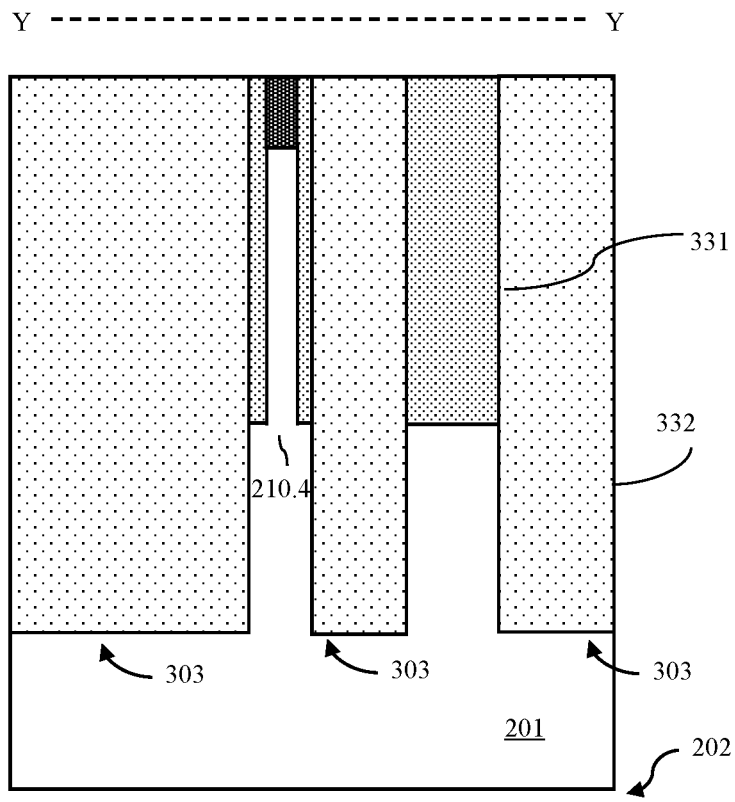
FIG. 3.5B
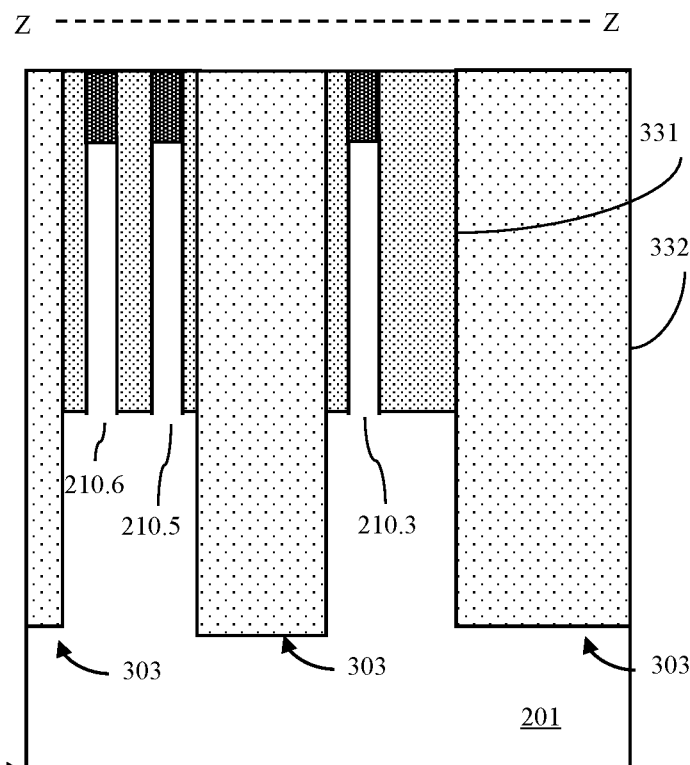
FIG. 3.5C

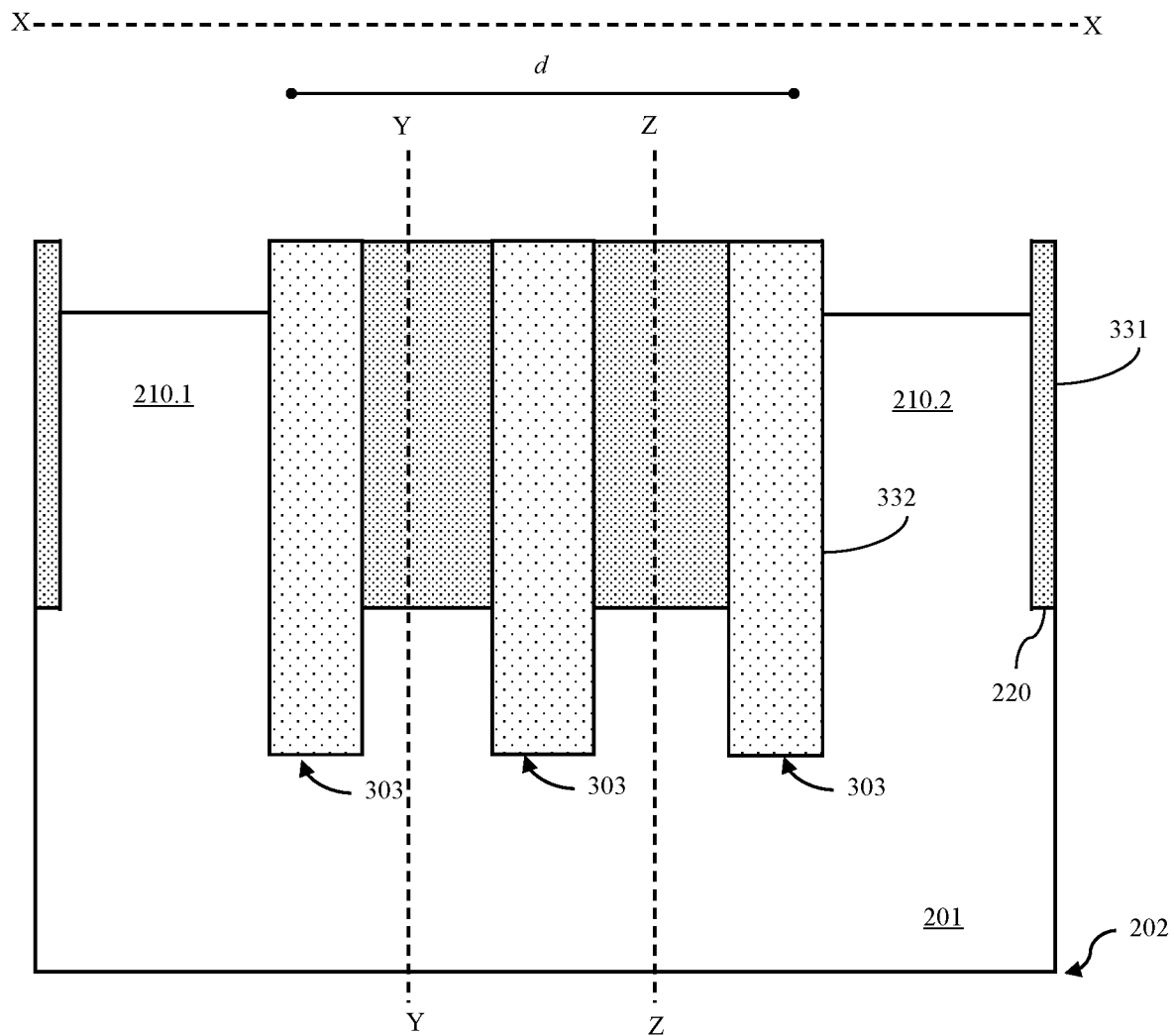
FIG. 3.6A

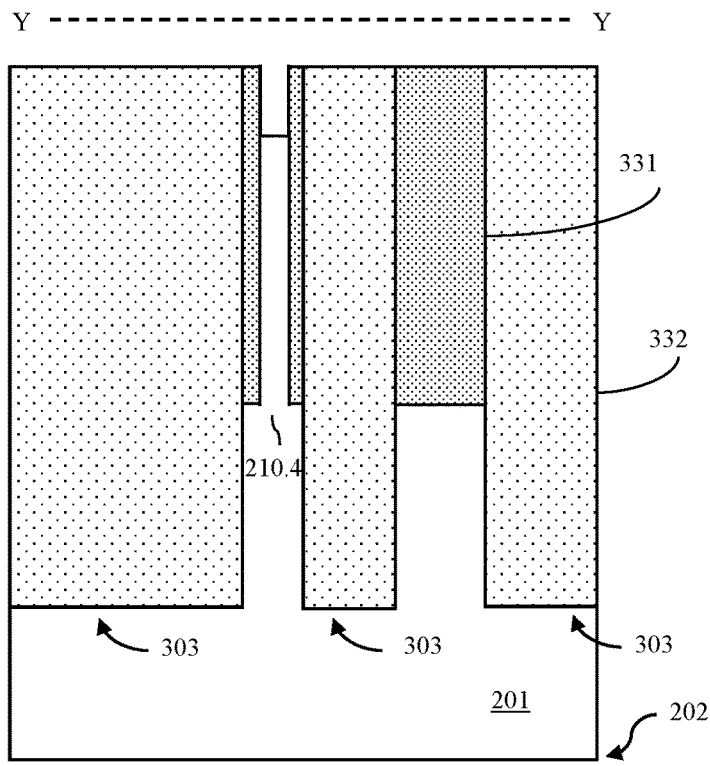
FIG. 3.6B
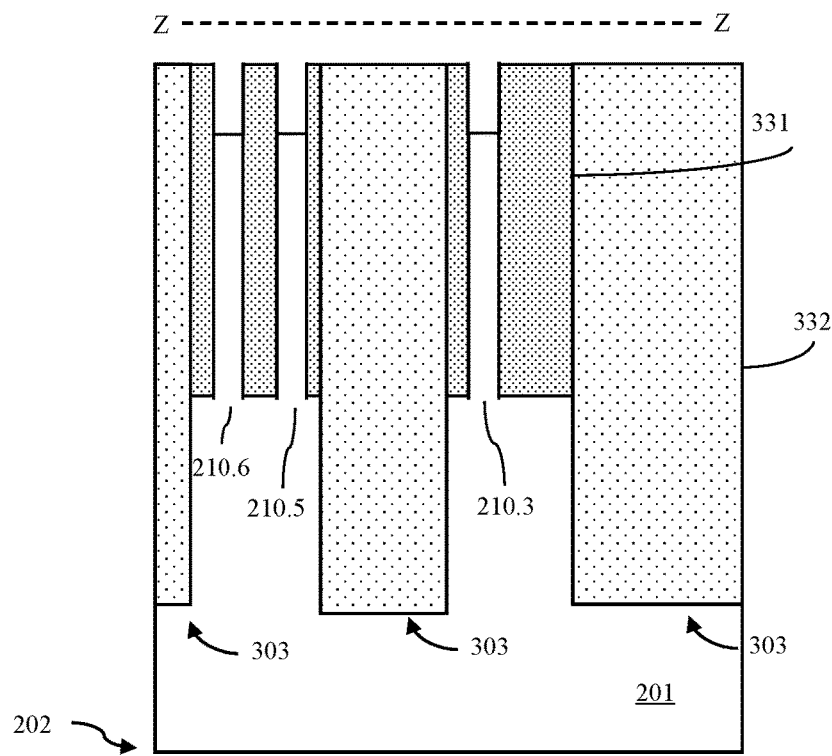
FIG. 3.6C

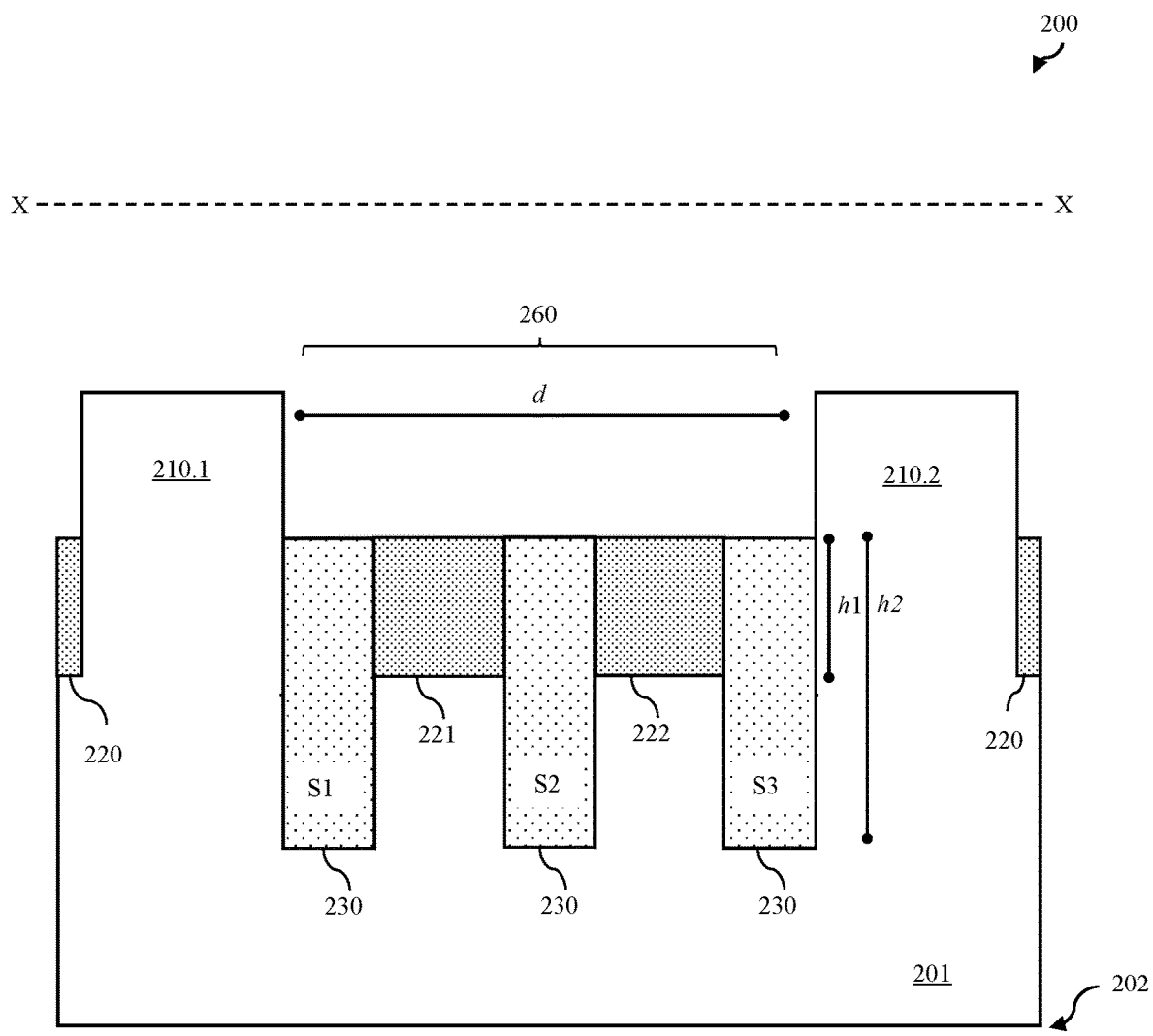
FIG. 3.7A

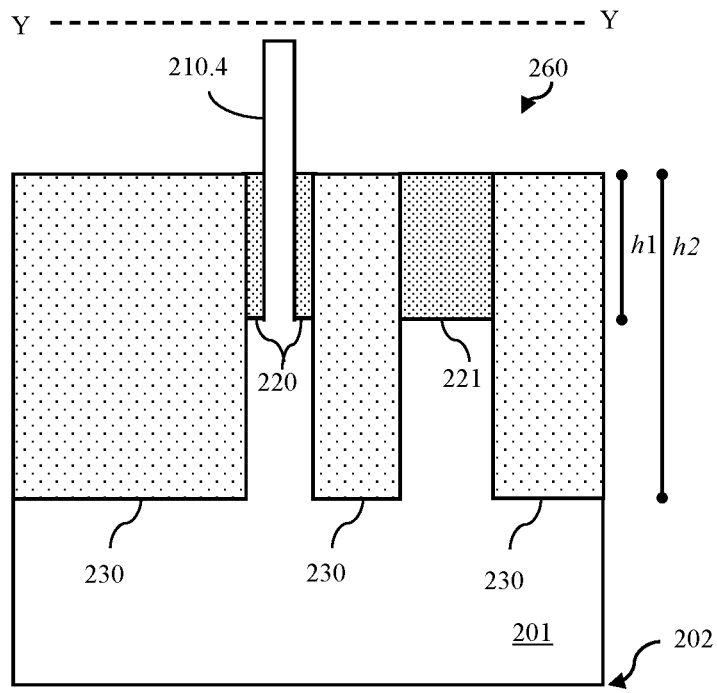
FIG. 3.7B
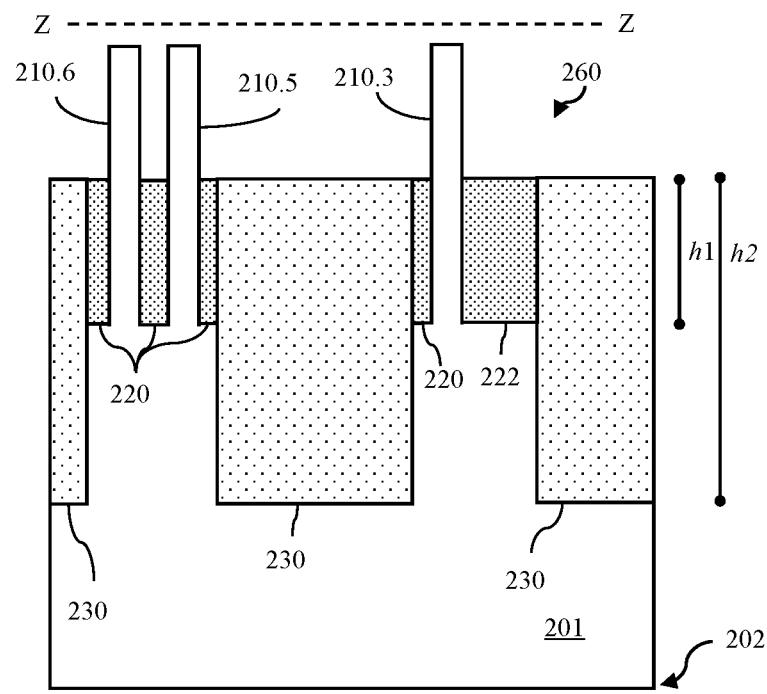
FIG. 3.7C

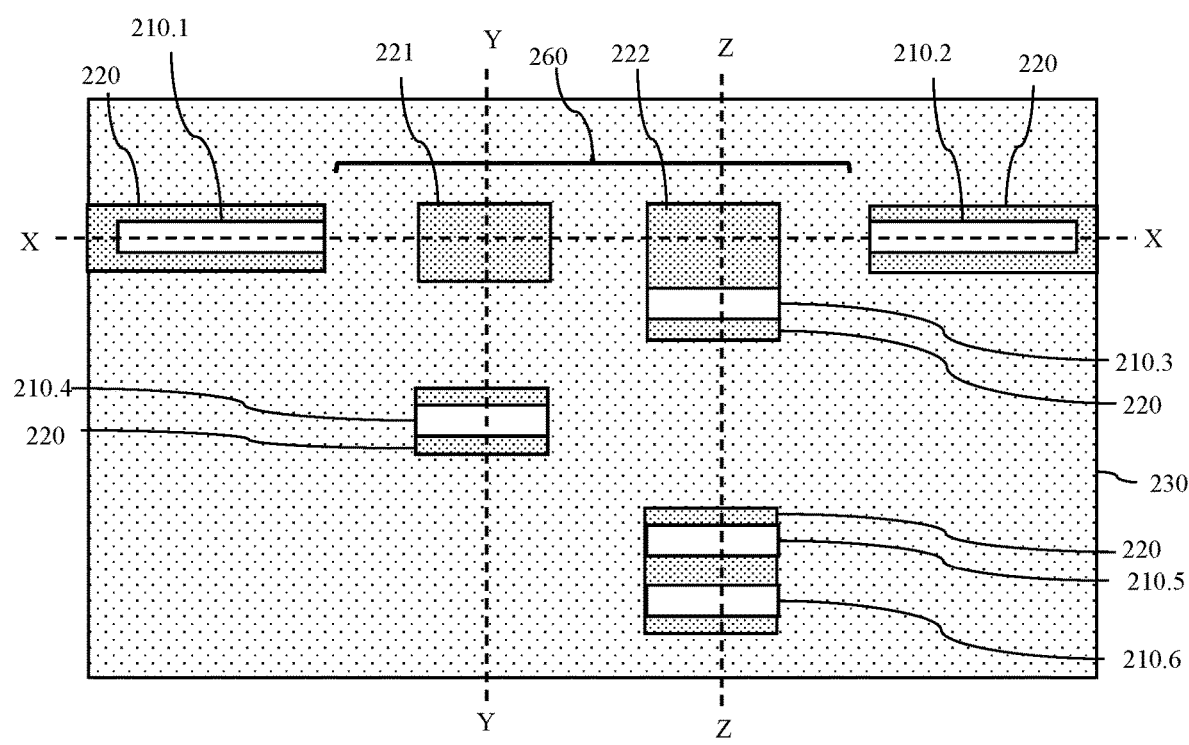
FIG. 3.7D

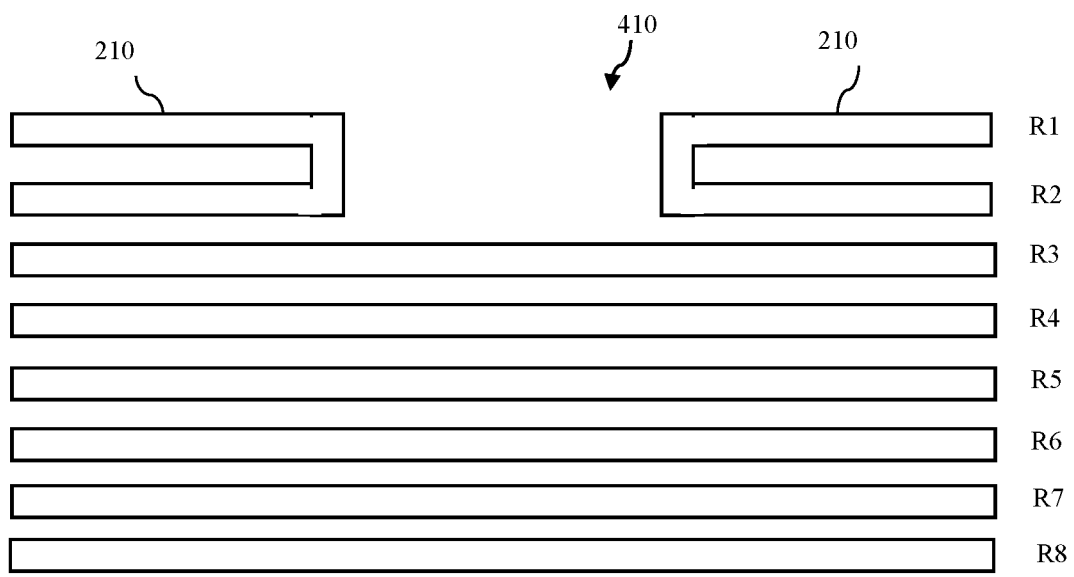
FIG. 4.1

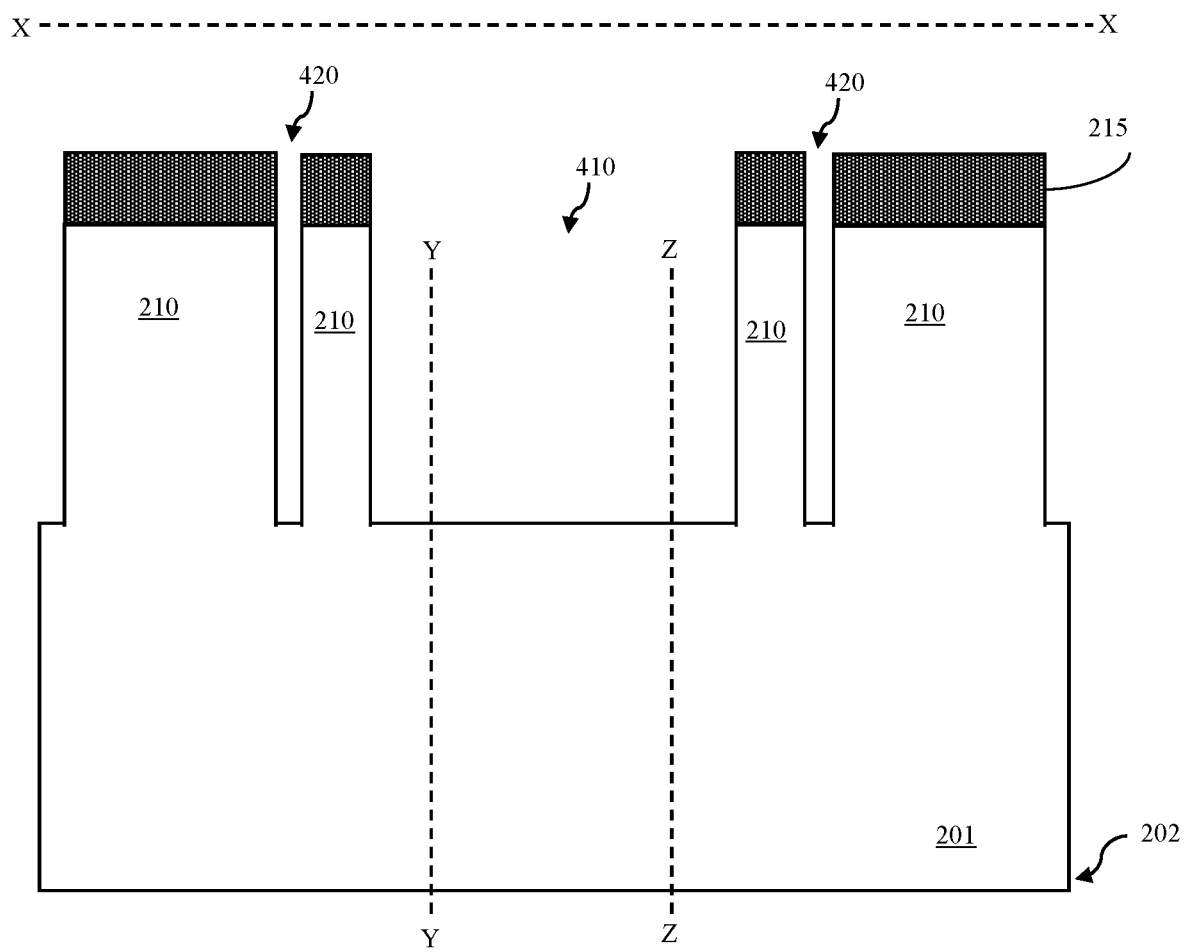
FIG. 4.2A

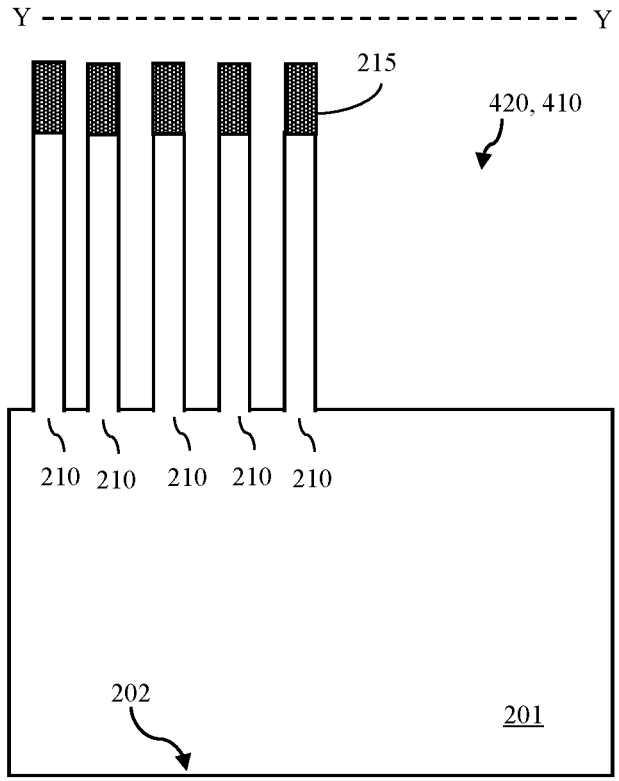
FIG. 4.2B
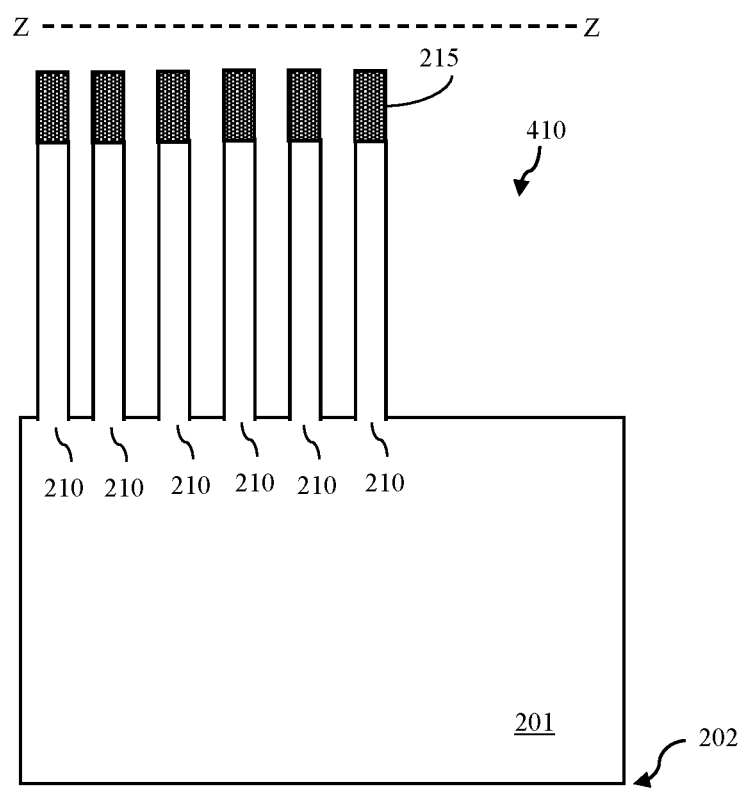
FIG. 4.2C

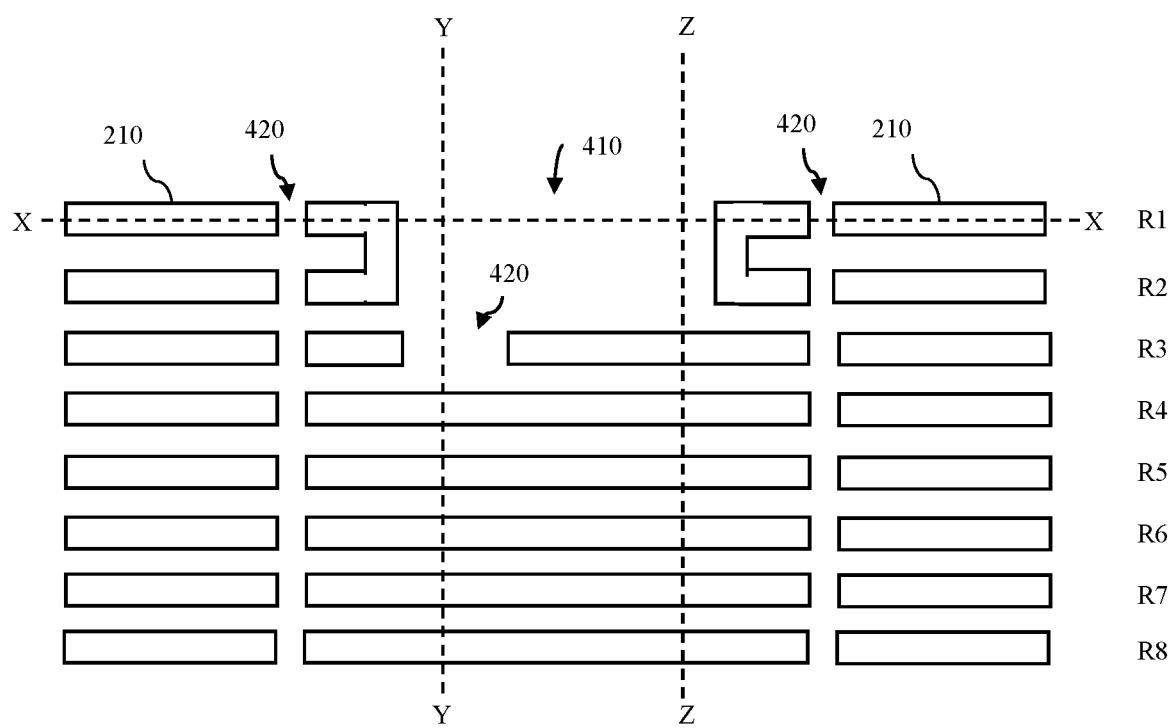
FIG. 4.2D

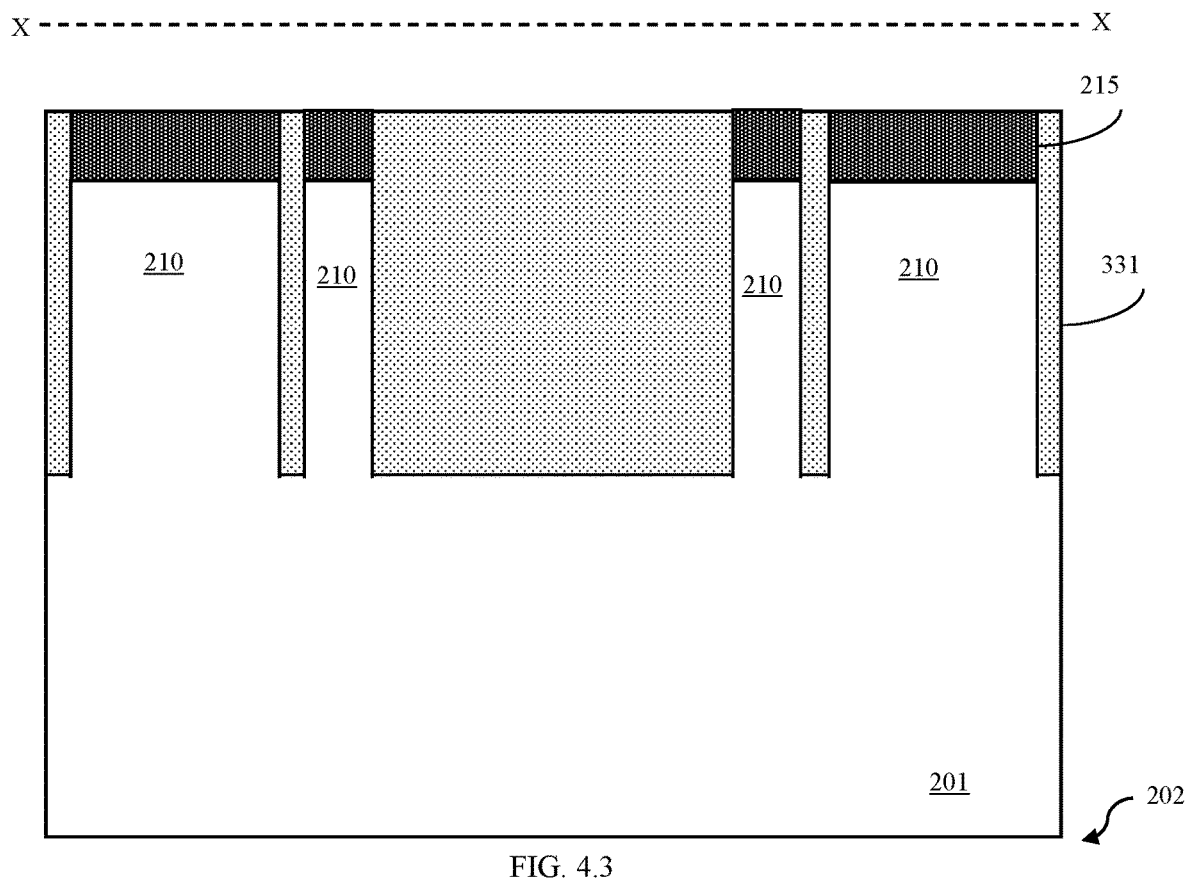
FIG. 4.3

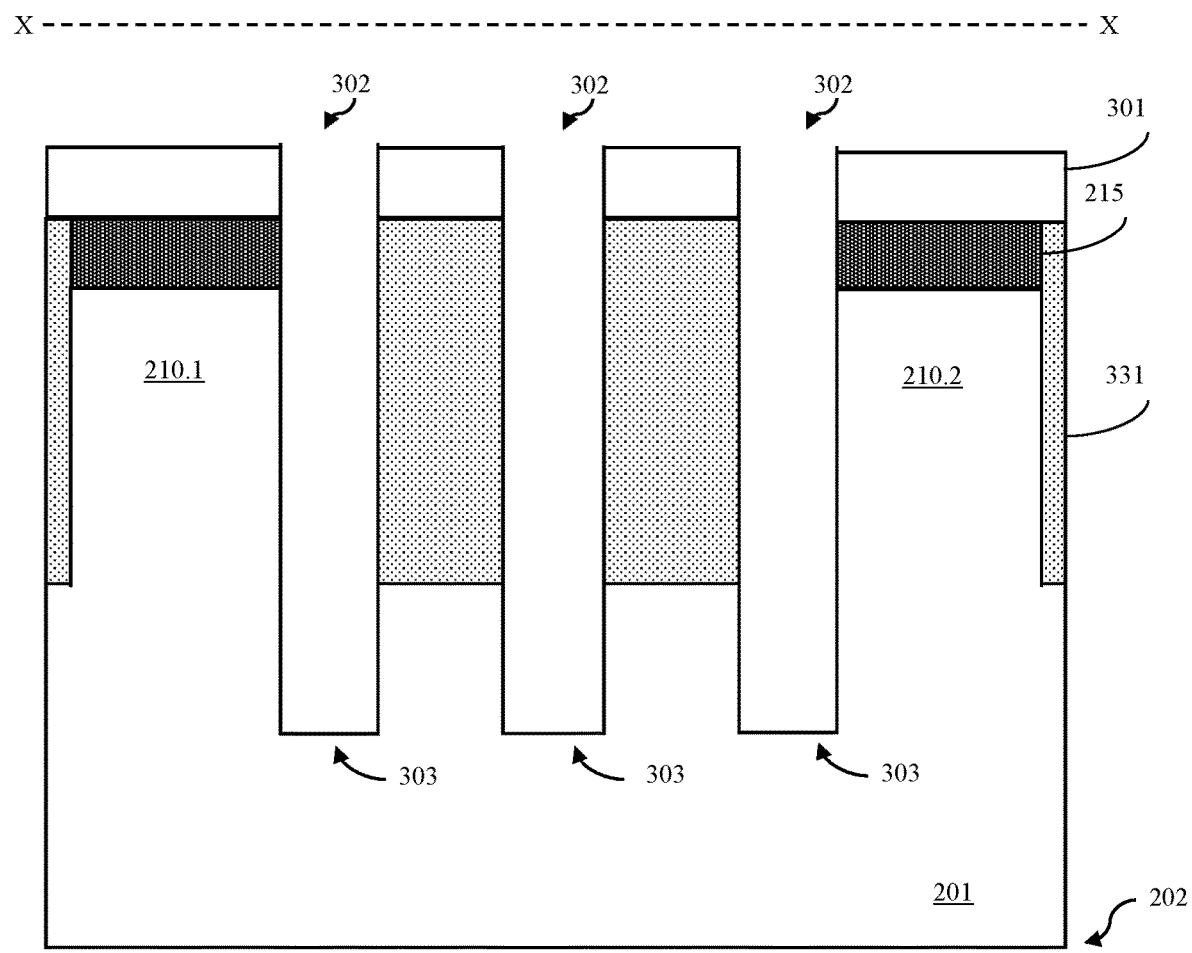
FIG. 4.4

SEMICONDUCTOR STRUCTURE WITH ISOLATION REGION INCLUDING COMBINATION OF DEEP AND SHALLOW TRENCH ISOLATION STRUCTURES AND METHOD

BACKGROUND

The present disclosure relates to fin-type semiconductor devices (e.g., fin-type field effect transistors (FINFETs)) and, more particularly, to embodiments of a semiconductor structure including a semiconductor fin for a fin-type semiconductor device and a method of forming the semiconductor structure.

Integrated circuit (IC) design decisions often account for device performance, device scalability, device density, manufacturing efficiency, costs, etc. For example, size scaling of planar field effect transistors (planar FETs) produces relatively short channel lengths, but the short channel lengths correspondingly increase short channel effects. FINFETs were developed to reduce such short channel effects. A FINFET is a non-planar FET that incorporates one or more semiconductor fins (i.e., one or more elongated, relatively tall and thin, essentially rectangular-shaped, semiconductor bodies). Within each semiconductor fin, a channel region is positioned laterally between source/drain regions. A gate structure is positioned adjacent to the top surface and opposing sidewalls of the semiconductor fin at the corresponding channel region, respectively. Such a FINFET exhibits multi-dimensional field effects as compared to the single-dimensional field effects exhibited by a planar FET and, thus, exhibits improved gate control over the channel region. However, in some structures, single-fin FINFETs tend to exhibit a relatively high off-state leakage current (Ioff).

SUMMARY

Disclosed herein are embodiments of a semiconductor structure. The semiconductor structure can include a semiconductor substrate and one or more semiconductor fins extending from semiconductor substrate. The semiconductor fin(s) can include at least a first semiconductor fin. The semiconductor structure can further include an isolation region on the semiconductor substrate positioned laterally adjacent to the first semiconductor fin. The isolation region can include a first isolation structure having a first height and a second isolation structure having a second height that is greater than the first height and the first isolation structure can be positioned laterally between and immediately adjacent to sections of the second isolation structure.

Some embodiments of the semiconductor structure disclosed herein can include a device, such as a single-fin FINFET. Specifically, some embodiments of the semiconductor structure disclosed herein can include a semiconductor substrate. The semiconductor structure can further include a device (e.g., a single-fin FINFET), which includes a first semiconductor fin extending from the semiconductor substrate. The semiconductor substrate can further include an isolation region on the semiconductor substrate positioned laterally adjacent to the first semiconductor fin. The isolation region can include a first isolation structure having a first height and a second isolation structure having a second height that is greater than the first height and the first isolation structure can be positioned laterally between and immediately adjacent to sections of the second isolation structure.

Also disclosed herein are method embodiments for forming the above-described semiconductor structures. For example, a method embodiment disclosed herein can include forming one or more semiconductor fins extending from a semiconductor substrate. The semiconductor fins can at least include a first semiconductor fin. Additionally, an isolation region can be formed on the semiconductor substrate positioned laterally adjacent the first semiconductor fin. This isolation region can specifically be formed so that it includes at least one first isolation structure having a first height and a second isolation structure having a second height that is greater than the first height, where the first isolation structure is positioned laterally between and immediately adjacent to sections of the second isolation structure.

BRIEF DESCRIPTION OF THE DRAWINGS

The present disclosure will be better understood from the following detailed description with reference to the drawings, which are not necessarily drawn to scale and in which:

FIG. 3.1 is a layout diagram illustrating a partially completed semiconductor structure formed according to a disclosed method embodiment;

FIG. 3.2A-3.2C are different cross-section diagrams and FIG. 3.2D is a layout diagram illustrating a partially completed semiconductor structure formed according to a method embodiment;

FIG. 3.3A-3.3C are different cross-section diagrams illustrating a partially completed semiconductor structure formed according to a method embodiment;

FIG. 3.4A-3.4C are different cross-section diagrams and FIG. 3.4D is a layout diagram illustrating a partially completed semiconductor structure formed according to a method embodiment;

FIG. 3.5A-3.5C are different cross-section diagrams illustrating a partially completed semiconductor structure formed according to a method embodiment;

FIG. 3.6A-3.6C are different cross-section diagrams illustrating a partially completed semiconductor structure formed according to a method embodiment;

FIG. 3.7A-3.7C are different cross-section diagrams and FIG. 3.7D is a layout diagram illustrating a partially completed semiconductor structure formed according to a method embodiment;

FIG. 4.1 is a layout diagram illustrating a partially completed semiconductor structure formed according to an alternative method embodiment;

FIG. 4.2A-4.2C are different cross-section diagrams and FIG. 4.2D is a layout diagram illustrating a partially completed semiconductor structure formed according to the alternative method embodiment;

FIG. 4.3 is a cross-section diagram illustrating a partially completed semiconductor structure formed according to the alternative method embodiment; and FIG. 4.4 is a cross-section diagram illustrating a partially completed semiconductor structure formed according to the alternative method embodiment.

DETAILED DESCRIPTION

Figure 1:
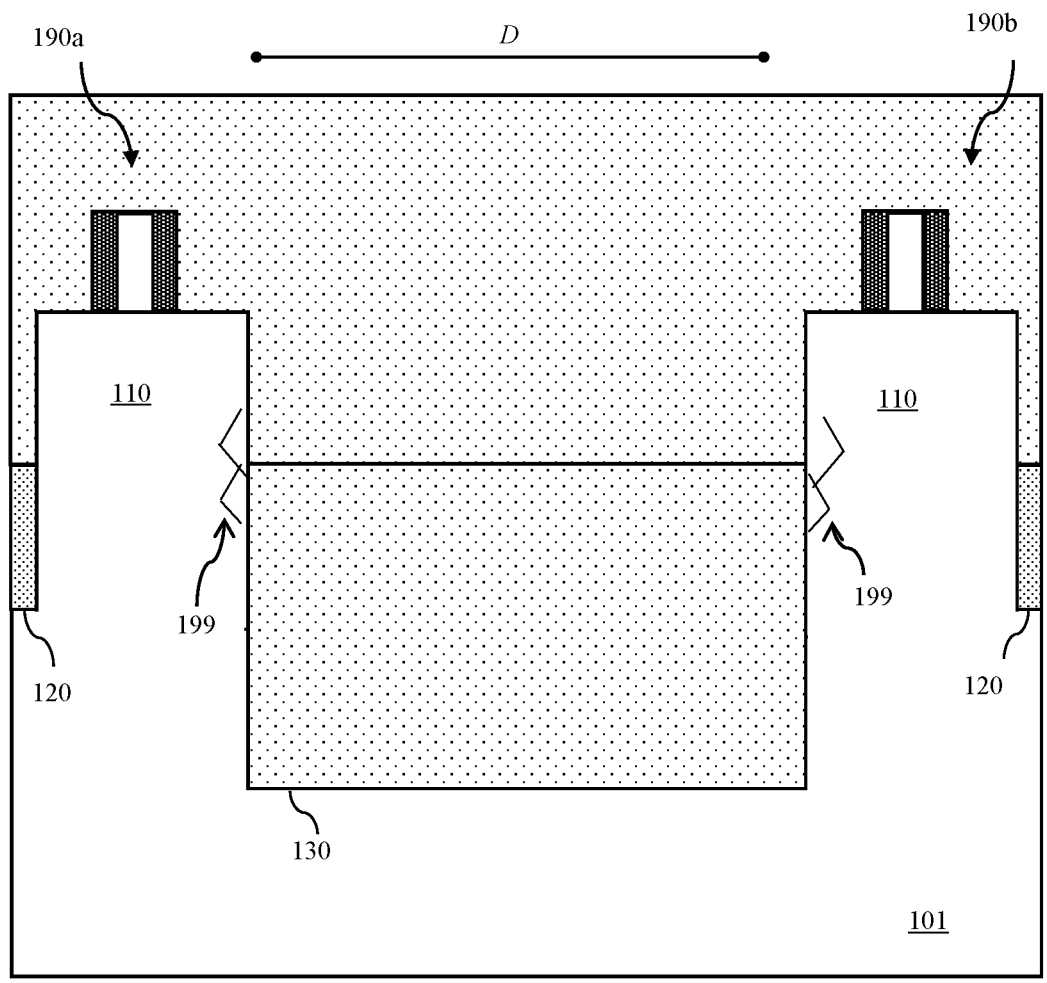
FIG. 1 is a cross-section diagram illustrating a semiconductor substrate with semiconductor fins having crystalline defects.

As mentioned above, single-fin FINFETs may exhibit a relatively high off-state leakage current (Ioff). Referring to FIG. 1, consider the case of single-fin FINFETs 190a-190b on a semiconductor substrate 101 separated by distance (D). High Ioff of such single-fin FINFETs 190a-190b may be the result of stress-induced crystalline defects 199 in the semiconductor fins 110 thereof. The stress-induced crystalline defects 199 may arise from shrinkage of the isolation material (e.g., silicon dioxide ($SiO_2$) or other suitable oxide material) of the deep trench isolation (DTI) structure 130, which extends laterally between the semiconductor fins 110.

In view of the foregoing, disclosed herein are embodiments of a semiconductor structure that includes a semiconductor fin (e.g., incorporated into single-fin fin-type semiconductor device, such as a single-fin FINFET or some other type of single-fin fin-type semiconductor device) and, adjacent to the semiconductor fin, an isolation region with alternating deep trench and shallow trench isolation structures. Specifically, the semiconductor structure can include a semiconductor substrate and, extending from the semiconductor substrate, a first semiconductor fin for a single-fin fin-type semiconductor device. The semiconductor structure can further include an isolation region on the semiconductor substrate adjacent to a lower portion of the first semiconductor fin. This isolation region can include at least one first isolation structure (e.g., a shallow trench isolation (STI) structure) positioned laterally between and immediately adjacent to sections of a second isolation structure (e.g., a deep trench isolation (DTI) structure). With this alternating DTI-STI-DTI configuration, overall shrinkage of the isolation material of the isolation region is reduced and, thus, so are stress-induced crystalline defects in the first semiconductor fin. By reducing the stress-induced crystalline defects device performance may be improved (e.g., Ioff may be reduced). Also disclosed herein are methods of forming such a semiconductor structure.

Figure 2A:
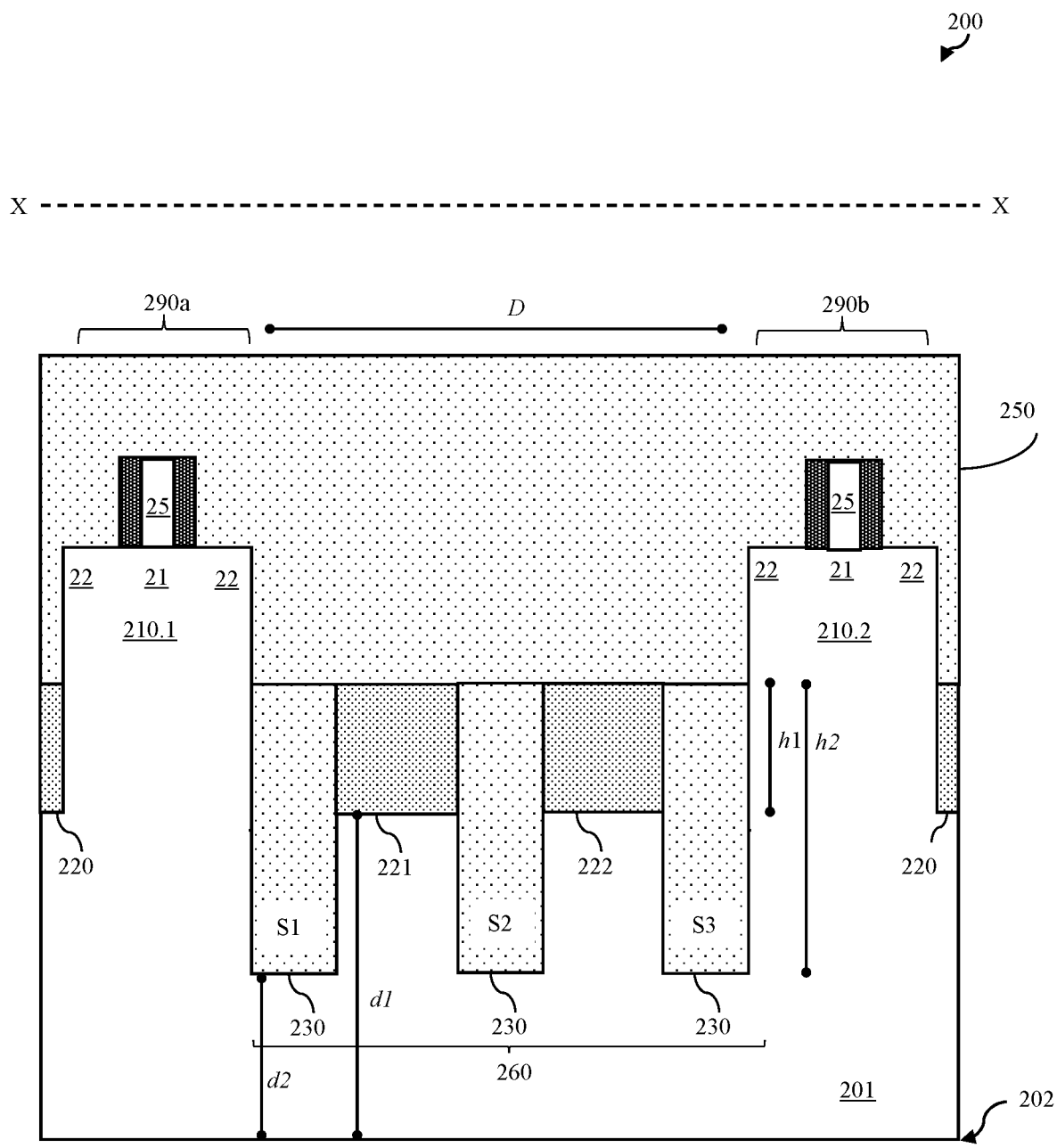
FIGS. 2A-2C are different cross-section diagrams and FIG. 2D is a layout diagram illustrating embodiments of a semiconductor structure.
Figure 2B:
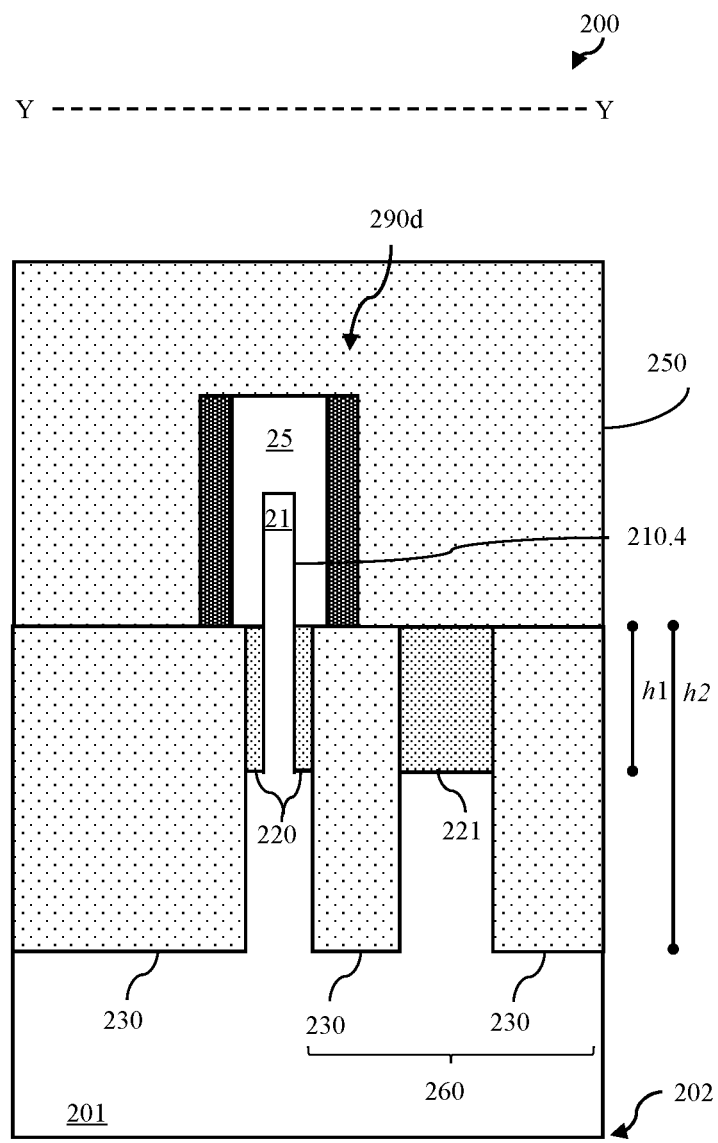
Figure 2C:
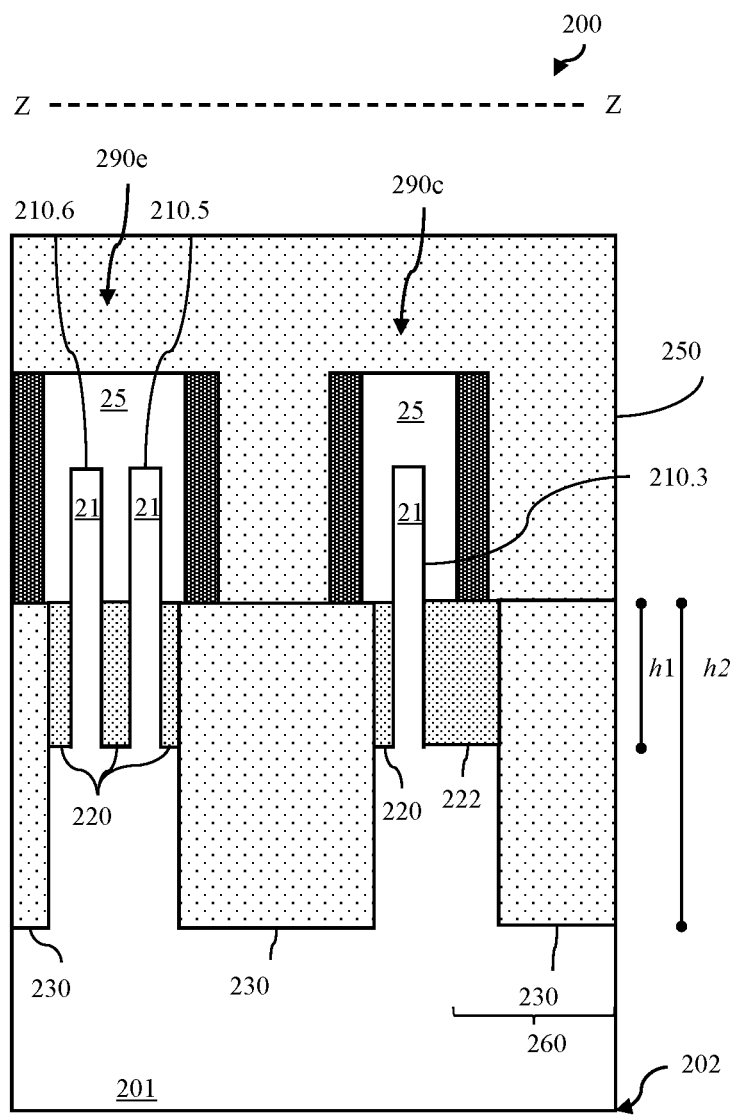
Figure 2D:
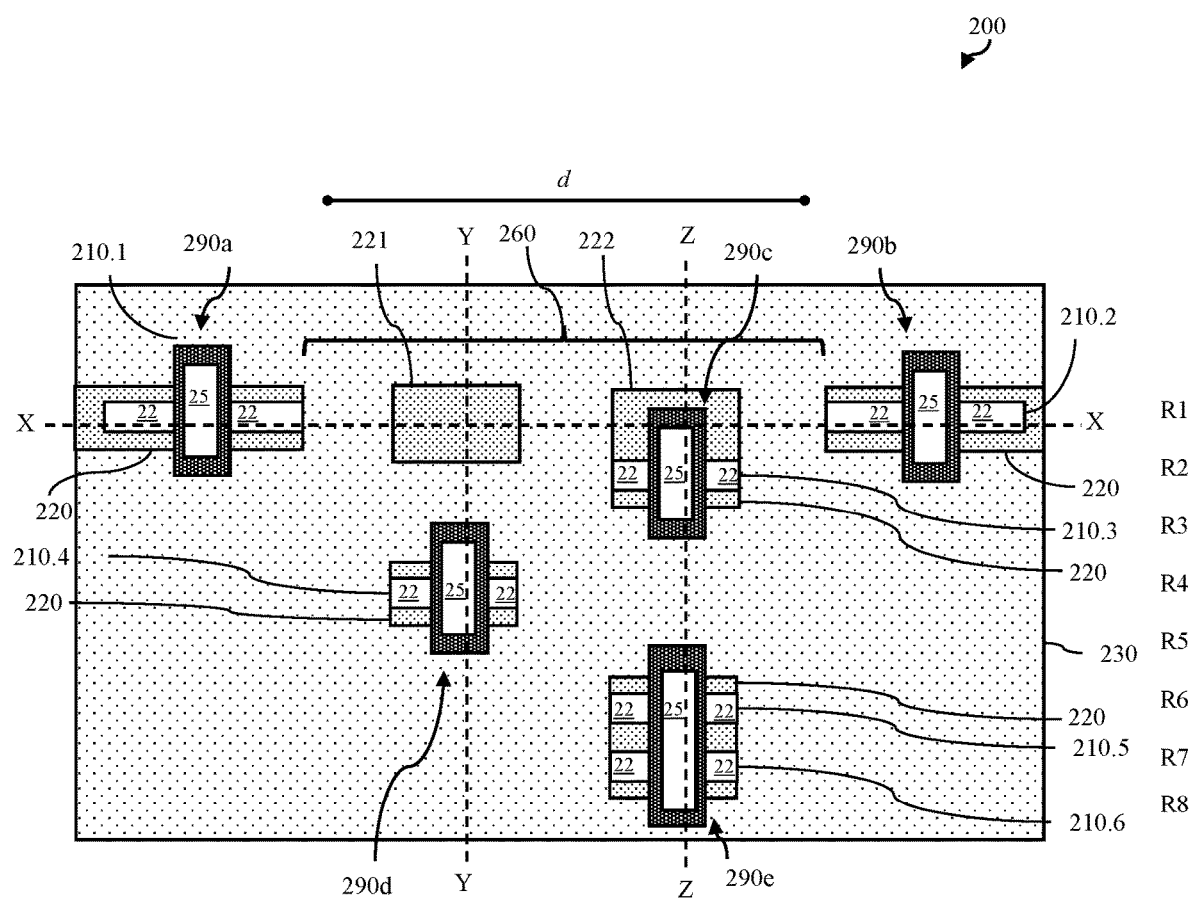

More particularly, FIGS. 2A-2C are different cross-section diagrams and FIG. 2D is a layout diagram illustrating embodiments of a semiconductor structure 200. The semiconductor structure 200 can include a bulk semiconductor substrate 201. The bulk semiconductor substrate 201 can be a bulk monocrystalline silicon (Si) substrate. Alternatively, the bulk semiconductor substrate 201 could be a bulk substrate of any other suitable monocrystalline semiconductor material (e.g., silicon germanium (SiGe), germanium (Ge), carbon-doped Si, or any other suitable monocrystalline semiconductor substrate). The semiconductor substrate 201 can have a bottom surface 202 and a top surface opposite the bottom surface 202.

The semiconductor structure 200 can further include one or more semiconductor fins patterned and etched into the upper portion of the semiconductor substrate 201 from the top surface. The semiconductor fins can include at least a first semiconductor fin 210.1 and, optionally, one or more additional semiconductor fins 210.2-210.6. For purposes of this disclosure, a "semiconductor fin" refers to a relatively thin, elongated, semiconductor body patterned and etched into an upper portion of the semiconductor substrate 201 so as to have a bottom adjacent to a remaining lower portion of the semiconductor substrate, a top surface opposite the bottom, and opposing sidewalls. Ideally, a semiconductor fin will have a three-dimensional essentially rectangular shape. That is, a semiconductor fin will have a uniform width between the opposing sidewalls from the bottom to the top surface, as illustrated in FIGS. 2B-2C. However, those skilled in the art will recognize that semiconductor fins are typically formed using a selective anisotropic etch process and, as a result of this etch process, the opposing sidewalls may not be perfectly vertical such that the resulting semiconductor fins may be wider at the bottom than they are at the top surface. For example, a semiconductor fin may have a height of 35-55 nm (e.g., 43 nm), a width at the bottom of 8-16 nm (e.g., 12), and a width (w) at the top surface of 6-10 nm (e.g., 8 nm). The dimensions are provided for illustration purposes and are not intended to be limiting.

In any case, as mentioned above, the semiconductor structure 200 can include at least a first semiconductor fin 210.1 and, optionally, one or more additional semiconductor fins (e.g., 210.2-210.6). More particularly, as discussed in detail below with regard to the method embodiments, multiple semiconductor fins can be patterned into the upper portion of the semiconductor substrate 201 to form rows of essentially parallel semiconductor fins with a uniform pitch (i.e., the sum of one fin width and one separation space between two adjacent semiconductor fins). The semiconductor fins with the rows (e.g., R1-R8) can be cut (e.g., segmented) or otherwise processed during fabrication so that, within the semiconductor structure 200, one or more of the initially formed rows of parallel semiconductor fins have no semiconductor fin, have a single semiconductor fin, or have multiple semiconductor fins in end-to-end alignment and so that in some adjacent rows the semiconductor fins are side-by-side semiconductor fins and in others they are completely offset. For example, as illustrated in FIG. 2D, within the semiconductor structure 200, first semiconductor fin 210.1 and second semiconductor fin 210.2 are in end-to-end alignment in R1 and separated by a distance (D); third semiconductor fin 210.3 is in R2 and completely offset from (e.g., positioned between) the first semiconductor fin 210.1 and the second semiconductor fin 210.2; no semiconductor fins remain in R3; fourth semiconductor fin 210.4 is in R4; no semiconductor fins remain in R5; fifth semiconductor fin 210.5 is in R6; sixth semiconductor fin 210.6 is in R7 side-by-side with the fifth semiconductor fin 210.5 in R6; and no semiconductor fins remain in R8. It should be understood that the layout of semiconductor fins 210.1-210.6 shown in FIG. 2D is provided for illustration purposes and is not intended to be limiting.

These semiconductor fin(s) can, for example, be incorporated into fin-type semiconductor device(s). Specifically, as discussed in greater detail below, the first semiconductor fin 210.1 can be incorporated into a first single-fin fin-type semiconductor device 290a. The additional semiconductor fins 210.2-210.6, if present, can similarly be incorporated into fin-type semiconductor devices. For example, the second semiconductor fin 210.2 can be incorporated into a second single-fin fin-type semiconductor device 290b, the third semiconductor fin 210.3 can be incorporated into a third single-fin fin-type semiconductor device 290c, the fourth semiconductor fin 210.4 can be incorporated into a fourth single-fin fin-type semiconductor device 290d, and the fifth and sixth semiconductor fins 210.5-210.6 can be incorporated into a multi-fin (two-fin) fin-type semiconductor device 290e.

Fin-type semiconductor device(s) 290a-290e can be FINFETs, as illustrated. As mentioned above, a FINFET is a non-planar FET that incorporates one or more semiconductor fins. Each semiconductor fin includes a channel region 21. The channel region 21 is positioned laterally between source/drain regions 22. Additionally, a gate 25 can be adjacent to the top surface and opposing sidewalls of all semiconductor fins incorporated therein at the corresponding channel region. Those skilled in the art will recognize that by incorporating additional semiconductor fins into a FINFET, the effective channel width and thereby the drive current can be increased. Alternatively, fin-type semiconductor device(s) 290a-290e could be any other type of fin-type semiconductor device (e.g., a resistor, a bipolar junction transistor (BJT), a heterojunction bipolar transistor (HBT) or a combination of such devices.

In any case, to reduce crystalline defects that have been noted in semiconductor fins of some single-fin fin-type semiconductor devices and, particularly, in those semiconductor fins of single-fin fin-type semiconductor devices that are positioned adjacent to a relatively large surface area isolation region 260, in the disclosed embodiments the isolation region 260 is not simply a DTI structure, but rather a combination of shallow trench isolation (STI) and DTI structures. Specifically, the isolation region 260 can be positioned laterally adjacent to a lower portion of the first semiconductor fin 210.1 and, optionally, can extend to a lower portion of the second semiconductor fin 210.2. The isolation region 260 can include at least one first isolation structure 221, 222 (e.g., at least one STI structure). The first isolation structure 221, 222 can have a first bottom, which is immediately adjacent to the semiconductor substrate 201 and separated from the bottom surface 202 of the semiconductor substrate by a first distance (d1), a first top opposite the first bottom, and a first height (h1), measurable from the first bottom to the first top. For purposes of illustration, two discrete first isolation structures 221-222 are shown in the figures. It should be understood that the figures are not intended to be limiting and that, alternatively, the isolation region 260 could include any number of one or more first isolation structures. The isolation region 260 can further include a second isolation structure 230. The second isolation structure can have a second bottom, which is immediately adjacent to the semiconductor substrate 201 and separated from the bottom surface 202 of the semiconductor substrate by a second distance (d2) that is greater than d1, a second top opposite the first bottom, and a second height (h2), measurable from the second bottom to the second top, that is greater than h1.

Within the isolation region 260, each first isolation structure 221, 222 can be positioned laterally between and immediately adjacent to sections of a second isolation structure 230. For example, as illustrated, first isolation structure 221 can be positioned laterally between sections S1 and S2 of the second isolation structure 230 and first isolation structure 222 can be positioned laterally between sections S2 and S3 of the second isolation structure. Thus, relative to vertical surface(s) of the first semiconductor fin 210.1 and (if present) the second semiconductor fin 210.2, the isolation region 260 has an alternating second isolation structure, first isolation structure, second isolation structure configuration (i.e., DTI-STI-DTI configuration). The alternating configuration can include at least one first isolation structure (i.e., at least one STI) and, optionally (e.g., depending upon the distance (D) between adjacent semiconductor fins), more than one first isolation region (e.g., see first isolation structures 221 and 222). It should be noted that any given first isolation structure within the isolation region 260 can be a discrete structure that is laterally surrounded (e.g., surrounded on all four sides in the case of a rectangular-shaped structure) by sections of the second isolation structure (e.g., see the first isolation structure 221). Alternatively, any given first isolation structure within the isolation region 260 could abut (i.e., be positioned laterally immediately adjacent to) the sidewall of a semiconductor fin in another fin-type semiconductor device in an adjacent row (e.g., see the first isolation structure 222 abutting the third semiconductor fin 210.3 of the single-fin fin-type semiconductor device 290c). As discussed in greater detail below with regard to the method, such a first isolation structure can be a replacement structure and, particularly, can replace a sacrificial portion of an elongated semiconductor fin in a given row and the STI regions that would otherwise be formed on either side thereof.

It should be noted that the semiconductor structure 200 can further include additional first isolation structures 220 (e.g., additional STI structures) positioned laterally immediately adjacent to the lower portion of each semiconductor fin (e.g., on one sidewall, on opposing sidewalls, on one end wall, on opposing end walls, or any combination thereof). For example, as illustrated in FIG. 2D, the semiconductor structure 200 could include the following: additional first isolation structures 220 positioned laterally immediately adjacent to the lower portion of the first semiconductor fin 210.1 on opposing sidewalls and, optionally, an end wall; additional first isolation structures 220 positioned laterally immediately adjacent to the lower portion of the second semiconductor fin 210.2 on opposing sidewalls and, optionally, an end wall; an additional first isolation structure 220 positioned laterally immediately adjacent to the lower portion of the third semiconductor fin 210.3 on a sidewall opposite the first isolation structure 222; etc. The additional first isolation structures 220 can have the same first height (h1) as each first isolation structure 221, 222 and can be separated from the bottom surface 202 of the semiconductor substrate 201 by the same first distance (d1). The additional first isolation structures 220 can, however, be narrower in width than the first isolation structures 221, 222. For example, see the third semiconductor fin 210.3 positioned between isolation structures 220 and 222 with different widths.

Each first isolation structure 221, 222 and any additional first isolation structure 220 (e.g., the STI structures) can include a first isolation material and the second isolation structure 230 (e.g., the DTI structure) can include a second isolation material that is either the same as or different from the first isolation material. Specifically, the first isolation material and the second isolation material could be the same isolation material (e.g., the same oxide or other dielectric). Alternatively, the first isolation material and the second isolation material could be different isolation materials (e.g., different oxide materials or other dielectrics).

In some embodiments, the first isolation material and the second isolation material can have different processing properties. For example, the first isolation material and the second isolation material could have different etch rates (e.g., due to different carbon concentrations or the like), when exposed to a given type of etchant. For example, in some embodiments, the second isolation material can be an oxide (e.g., silicon dioxide ($SiO_2$) or some other suitable oxide) and the first isolation material can be a carbon-doped oxide (e.g., carbon-doped $SiO_2$ or some other suitable oxide that is carbon-doped). In other embodiments, both the second isolation material and the first isolation material can be carbon-doped oxides (e.g., carbon-doped $SiO_2$) with the concentration of carbon being higher in the first isolation material than in the second isolation material. In either case, due to the higher carbon concentration in the first isolation material of the first isolation structures 220-222 (e.g., the STI structures) as compared to the carbon concentration in the second isolation material of the second isolation structure 230 (e.g., the DTI structure), the etch rate of the first isolation material in an etchant (e.g., in a hydrofluoric (HF) solution, such as a 1:100 HF solution, can be different than (e.g., faster than) the etch rate of the second isolation material in the same etchant. For example, the etch rate of the first isolation material in a 1:100 HF solution can be, for example, >5 Å/second, whereas the etch rate of the second isolation material in the same HF solution can be, for example, <1 Å/second.

It should be noted that the above-description of the first and second isolation materials is provided for illustration purposes and is not intended to be limiting. Alternatively, other isolation material(s) or combinations of isolation materials can be employed for the first isolation structures (e.g., the STI structures) and/or for the second isolation structure (e.g., the DTI structure). The first isolation material of the first isolation structures can include a single layer of isolation material or multiple layers of the same or different isolation materials and/or the second isolation material of the second isolation structures could be a single layer of isolation material or multiple layers of the same or different isolation materials. For example, the first isolation structures and/or the second isolation structure could include a conformal dielectric liner and a dielectric fill material on the conformal dielectric liner.

Depending upon the first and second isolation materials used, the first top of each first isolation structure 221, 222 (and any additional first isolation structures 220) and the second top of each section of the second isolation structure 230 can be essentially co-planar (e.g., in the same plane or in parallel planes separated by less than 5 nm) or in different planes above-the level of the bottom surface 202 of the semiconductor substrate 201. For example, if/when the first isolation and second isolation materials are the same, the first and second tops can be essentially co-planar. Alternatively, if/when the first and second isolation materials are different (e.g., as discussed above) such that they have different etch rates, the first top of each first isolation structure 221, 222 (and any additional first isolation structure 220) and the second top of each section of the second isolation structure 230 may be in different planes at different levels above the bottom surface 202 of the semiconductor substrate 201 (e.g., the second top can be at a lower level above the bottom surface or, alternatively, the second top can be at a higher level above the bottom surface 202).

Additionally, the semiconductor structure 200 can further including various additional features (some of which are not shown to avoid clutter in the drawings). These additional features include, but are not limited to: metal silicide layers (e.g., cobalt silicide layers, nickel silicide layers, tungsten silicide layers, or layers of any other suitable metal silicide material, which are not shown to avoid clutter in the drawings) on device terminals; one or more layers of interlayer dielectric (ILD) material 250 (e.g., a relatively thin conformal etch stop layer, such as a relatively thin SiN layer, and, on the etch stop layer, a blanket layer of $SiO_2$ doped silicon glass, such as phosphosilicate glass (PSG) or borophosphosilicate glass (BPSG), or any other suitable ILD material) over the semiconductor device(s); middle of the line (MOL) contacts extending through the ILD material 250 to device terminals; and back end of the line (BEOL) metal levels that electrically connect the semiconductor device(s) to other on-chip or off-chip components. MOL and BEOL features are well known in the art and, thus, the details thereof have been omitted from this specification to allow the reader to focus on the salient aspects of the disclosed embodiments.

In any case, due to the configuration of the isolation region 260 with the first isolation structure(s) 221, 222 positioned laterally between sections of the second isolation structure 230 (e.g., with the alternating DTI-STI-DTI configuration), overall shrinkage of the isolation materials in the isolation region 260 during anneal processing is reduced and, thus, so are stress-induced crystalline defects in the adjacent semiconductor fin(s) (e.g., the first semiconductor fin 210.1 and, if applicable, the second semiconductor fin 210.2). By minimizing stress-induced crystalline defects in the first semiconductor fin 210.1 and, if applicable, the second semiconductor fin 210.2, performance of the single-fin fin-type semiconductor device(s) (e.g., 290a and, if applicable, 290b) may be improved (e.g., Ioff may be reduced).

Also disclosed herein are method embodiments for forming a semiconductor structure, such as the semiconductor structure 200 described above and illustrated in FIGS. 2A-2D, which includes at least one semiconductor fin 210.1 (e.g., incorporated into single-fin fin-type semiconductor device 290a, such as a single-fin FINFET or some other type of single-fin fin-type semiconductor device) and, adjacent to the semiconductor fin 210.1, an isolation region 260 with alternating deep trench and shallow trench isolation structures.

More particularly, the method can include providing a bulk semiconductor substrate 201. The bulk semiconductor substrate can be a bulk monocrystalline silicon (Si) substrate. Alternatively, the bulk semiconductor substrate could be a bulk substrate of any other suitable monocrystalline semiconductor material (e.g., silicon germanium (SiGe), germanium (Ge), carbon-doped Si, or any other suitable monocrystalline semiconductor substrate. The semiconductor substrate 201 can have a bottom surface 202 and a top surface opposite the bottom surface.

The method can further include forming multiple semiconductor fins 210 on the semiconductor substrate 201 (e.g., see layout diagram of FIG. 3.1 with eight rows (R1-R8) of semiconductor fins 210). The semiconductor fins 210 can be patterned and etched. For example, the semiconductor fins 210 can be patterned and etched using a conventional self-aligned double patterning (SADP) process (also referred to herein as a sidewall image transfer (SIT) process). For example, a hard mask layer 215 (e.g., a silicon nitride (SiN) hard mask layer) can be formed on the top surface of the semiconductor substrate 201. Parallel mandrels formed above the hard mask layer (e.g., using conventional lithographic patterning and etch techniques). Sidewall spacers can be formed on the sidewalls of the mandrels. That is, a sidewall spacer material can be conformally deposited over the partially completed structure. Then, an anisotropic etch process can be performed in order to remove the sidewall spacer material form horizontal surfaces, leaving it intact as sidewall spacers on the sidewalls of the mandrels. Sidewall spacers on the end of the mandrels can be removed (e.g., using a masked etch process). Then, the mandrels can be selectively removed, thereby leaving pairs of parallel sidewall spacers (e.g., four pairs of parallel semiconductor fins) spaced across the partially completed structure. Anisotropic etch processes (e.g., reactive ion etch (RIE) processes) can then be performed using the sidewall spacers as mask sections, thereby transferring an image of the sidewall spacers into the hard mask layer and further into the upper portion of the semiconductor substrate 201 below. The sidewall spacers can be removed, leaving intact eight parallel semiconductor fins 210, each with a dielectric fin cap (e.g., a SiN cap left over from the hard mask layer 215). Alternatively, the semiconductor fins 210 could be patterned and etched using any other suitable processes (e.g., conventional lithography).

In any case, as discussed above with regard to the structure embodiments, a "semiconductor fin" refers to a relatively thin, elongated, semiconductor body. Each semiconductor fin could have a uniform width between the opposing sidewalls from the bottom to the top surface, as illustrated. However, the etch process used in fin formation, as described above, can result in the fins being wider at the bottom than they are at the top surface. Following fin formation, a conventional fin cut process can be performed in order to make various cuts 320 into the semiconductor fins 210, as shown in the different cross-section diagrams FIGS. 3.2A-3.2C and the layout diagram of FIG. 3.2D.

A first isolation material 331 for first isolation structure(s) (e.g., STI structures) can be deposited so as to fill the spaces between the semiconductor fins 210, as well as the various cuts 320 within the semiconductor fins 210. Deposition of the first isolation material 331 can be, for example, by flowable chemical vapor deposition (FCVD) or any other suitable deposition process. Then, a polishing process (e.g., a chemical mechanical polishing (CMP) process) can be performed to remove any of the first isolation material from above the fin caps 215.

Next, as illustrated in the different cross-section diagrams of FIGS. 3.4A-3.4C and the layout diagram of FIG. 3.4D, a mask layer 301 can be formed above the multiple semiconductor fins 210 and the first isolation material 331 therebetween. Conventional lithographic patterning and etch processes can be performed to form, within the mask layer 301, a relatively large opening 302 that will define the shape of a second isolation structure (e.g., a DTI structure). An anisotropic etch process can be performed in order to form a deep trench 303 aligned below the opening 302. Deep trench 303 can extend into the semiconductor substrate 201 through any semiconductor fins and the first isolation material 331 exposed within the opening 302.

As illustrated in the different cross-section diagrams of FIGS. 3.5A-3.5C, a second isolation material 332 for second isolation structure (e.g., DTI structure) can be deposited to fill the deep trench 303. Deposition of the second isolation material 332 can be, for example, by high density plasma (HDP) deposition, by a high aspect ratio process (HARP) or any other suitable deposition process. Then, a polishing process (e.g., a CMP process) can be performed to remove any of the second isolation material from above the fin caps 215.

It should be noted that the first isolation material 331 and the second isolation material 332 can be the same isolation materials (e.g., the same oxide or other dielectric) or different isolation materials (e.g., different oxides or other dielectrics). In some embodiments, the first isolation material and the second isolation material can have different processing properties. For example, the first isolation material and the second isolation material could have different etch rates when exposed to a given type of etchant. For example, in some embodiments, the second isolation material can be an oxide (e.g., silicon dioxide ($SiO_2$) or other suitable oxide) and the first isolation material can be a carbon-doped oxide (e.g., carbon-doped $SiO_2$ or some other suitable oxide that is carbon-doped). In other embodiments, both the second isolation material and the first isolation material can be carbon-doped oxides (e.g., carbon-doped $SiO_2$) with the concentration of carbon being higher in the first isolation material than in the second isolation material. In either case, due to the higher carbon concentration in the first isolation material 331 as compared to the carbon concentration in the second isolation material 332, the etch rate of the first isolation material in an etchant (e.g., an HF solution, such as a 1:100 HF solution, can be different than (e.g., can be faster than) the etch rate of the second isolation material in the same etchant. For example, the etch rate of the first isolation material 331 in a 1:100 HF solution can be, for example, >5 Å/second, whereas the etch rate of the second isolation material 332 in the same HF solution can be, for example, <1 Å/second.

It should be noted that the above-description of the first and second isolation materials is provided for illustration purposes and is not intended to be limiting. Alternatively, other isolation material(s) or combinations of isolation materials can be employed for the first isolation structures (e.g., the STI structures) and/or for the second isolation structure (e.g., the DTI structure). The first isolation material of the first isolation structures can include a single layer of isolation material or multiple layers of the same or different isolation materials and/or the second isolation material of the second isolation structures could be a single layer of isolation material or multiple layers of the same or different isolation materials. For example, the first isolation structures and/or the second isolation structure could include a conformal dielectric liner and a dielectric fill material on the conformal dielectric liner.

The fin caps 215 can be removed (e.g., using a conventional wet or dry etch process selective to SiN), as shown in the different cross-section diagrams of FIGS. 3.6A-3.6C. Additionally, first and second isolation materials 331-332 can be selectively recessed (e.g., using a conventional wet etch process selective to the isolation materials, e.g., selective to oxides), as shown in the different cross-section diagrams of FIGS. 3.7A-3.7C and the layout diagram of FIG. 3.7D). Recessing of the first and second isolation materials 331-332 exposes upper portions of the semiconductor fins (e.g., 210.1-210.6). Additionally, recessing the first and second isolation materials 331-332 completes the first isolation structures 220-221 (e.g., the STI structures) and the second isolation structure 230 (e.g., the DTI structure) and thereby completes the isolation region 260, which is described in detail above with regard to the semiconductor structure 200 and which at least includes an alternating second isolation structure-first isolation structure-second isolation structure configuration (e.g., an alternating DTI-STI-DTI configuration) adjacent to a lower portion of a first semiconductor fin 210.1 and, optionally, extending laterally between lower portions of the first semiconductor fin 210.1 and a second semiconductor fin 210.2.

It should be noted that the technique described above and illustrated in FIGS. 3.1-3.7D, is provided for illustration purposes and is not intended to be limiting. Any other suitable technique could alternative be used. For example, in other embodiments, the mandrels can be patterned or cut so that, following the SIT process, there are two U-shaped semiconductor fins separated by a relatively large space 410 in R1-R2 as well as six parallel semiconductor fins 210 in R3-R8, see FIG. 4.1. The remaining process steps are essentially the same including a fin cut process to form fin cut regions 420 (as shown in FIGS. 4.2A-4.2B), a first isolation material 331 deposition process and CMP process (as shown in FIG. 4.3), a deep trench 303 formation process (see FIG. 4.4), etc. However, in this case, there is not a center semiconductor fin to remove from between the first semiconductor fin 210.1 and the second semiconductor fin 210.2, during the deep trench 303 etch process shown in FIG. 4.4. At this point, the partially completed semiconductor structure shown in FIG. 4.4 is essentially the same as that shown in FIGS. 3.4A-3.4D and processing can proceed accordingly.

In any case, during subsequent processing, fin-type semiconductor devices 290a-290e can be formed using the semiconductor fins 210.1-210.6. For example, as shown in FIGS. 2A-2D, a first single-fin fin-type semiconductor device 290a can be formed using the first semiconductor fin 210.1 and, optionally, a second single-fin fin-type semiconductor device 290b can be formed using the second semiconductor fin 210.2, a third single-fin fin-type semiconductor device 290c can be formed using the third semiconductor fin 210.3, a fourth single-fin fin-type semiconductor device 290d can be formed using the fourth semiconductor fin 210.4, and a multi-fin fin-type semiconductor device 290e can be formed using the fifth and sixth semiconductor fins 210.5-210.6. In some embodiments, conventional FINFET processing techniques can be employed to form the fin-type semiconductor devices 290a-290e as FINFETs. In other embodiments, different processing techniques can be used to form the fin-type semiconductor devices 290a-290e as other devices (e.g., resistors, BJTs, HBTs, etc.) or to form the fin-type semiconductor devices 290a-290e as a combination of any such devices.

It should be noted that in the structures and methods described above a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

As mentioned above, each device 290a-290e can be an NFET (e.g., intrinsic or P-channel region(s) 21 positioned laterally between N+ source/drain regions 22 and a gate structure ("gate") 25 adjacent the top surface and opposing sides of each semiconductor fin at the channel region 21) or a PFET (e.g., with intrinsic or N− channel region(s) 21 positioned laterally between P+ source/drain regions 22 and a gate structure 25 adjacent to the top surface and opposing sides of each semiconductor fin at the channel region(s) 21). Alternatively, the devices 290a-290e could include a combination NFET and PFET devices. In these devices 290a-290e, gate 25 can be electrically isolated from the adjacent source/drain regions 22 by gate sidewall spacers. Source/drain regions 22 can have any suitable FINFET source/drain region configuration. For example, the source/drain regions 22 could include in situ doped epitaxial semiconductor material grown on top and side surfaces of the fin(s) or within trench etched into the surface of the fin and/or dopant implant regions within the fin(s). Gate 25 could have any suitable FINFET gate configuration including, but not limited to, a gate-first polysilicon configuration, a gate-first high-K metal gate (HKMG) configuration, or a replacement metal gate (RMG) configuration. Those skilled in the art will recognize that a gate-first polysilicon gate can include, for example: a silicon dioxide gate dielectric layer; a doped polysilicon gate conductor layer on the silicon dioxide gate dielectric layer; and, optionally, a metal silicide layer (e.g., CoSi, NiSi, WSi, TiSi, or any other suitable metal silicide material layer) on the doped polysilicon gate conductor layer. A gate-first HKMG can include, for example: an interfacial layer (e.g., a silicon oxynitride layer) on the semiconductor layer; a high-K gate dielectric layer (i.e., a layer of dielectric material with a dielectric constant that is greater than 3.9 including, for example, hafnium (Hf)-based dielectrics, such as hafnium oxide, hafnium silicon oxide, hafnium silicon oxynitride, or hafnium aluminum oxide, or other suitable high-k dielectrics, such as aluminum oxide, tantalum oxide, or zirconium oxide) on the interfacial layer; one or more stacked metal layers (e.g., a metal capping layer and an additional metal material layer suitable for dipole formation on the metal capping layer) on the high-K gate dielectric layer; an optional doped polysilicon gate conductor layer on the metal gate conductor layer(s); and an optional metal silicide layer, on the doped polysilicon gate conductor layer. Alternatively, the gate 25 could be any other suitable type of gate stack (e.g., RMG), which includes, for example: a high-K gate dielectric layer; a work function metal layer on the high-K gate dielectric layer; an optional doped polysilicon gate conductor layer on the work function metal layer; and an optional metal silicide layer, on the doped polysilicon gate conductor layer.

Various different gate-first and replacement gate structures are known in the art and, thus, the details of such gate structures have been omitted from this specification in order to allow the reader to focus on the salient aspects of the disclosed embodiments. However, those skilled in the art will recognize that the configuration of the gate stack of the gate 50 can vary depending upon whether the FINFET is an NFET or a PFET. For example, the optimal effective work function for the gate structure of an NFET is between about 3.9 eV and about 4.2 eV, whereas the optimal effective work function for the gate structure of a PFET is between about 4.9 eV and about 5.2 eV. In a gate-first polysilicon gate stack, the desired effective work function can be achieved, for example, by doping the polysilicon gate conductor layer with different dopants. For example, in an NFET, the polysilicon gate conductor layer can be doped with an N-type dopant (e.g., phosphorous (P), arsenic (As) or antimony (Sb)). In a PFET, the polysilicon gate conductor layer can be doped with P-type dopant (e.g., boron (B)). In a gate-first HKMG, the desired effective work function can be achieved, for example, using different metal layers on the high-K gate dielectric layer. For example, in an NFET, the metal layers on the high-K gate dielectric layer can include a titanium nitride (TiN) capping layer and, on the TiN capping layer, a lanthanum (La) layer for optimal NFET-specific dipole formation. In a PFET, the metal layers on the high-K gate dielectric layer can include a TiN capping layer and, on the TiN capping layer, an aluminum (Al) layer for optimal PFET-specific dipole formation. In an RMG, the desired effective work function can be achieved, for example, using different work function metal layers immediately adjacent to the high-K gate dielectric layer. Metals (and metal alloys), which have a work function within the range optimal for NFET performance (i.e., between 3.9 eV and about 4.2 eV) include, but are not limited to, hafnium, zirconium, titanium, tantalum, aluminum, and alloys thereof, such as, hafnium carbide, zirconium carbide, titanium carbide, tantalum carbide, and aluminum carbide. Metals (and metal alloys), which have a work function within the range optimal for PFET performance (i.e., between about 4.9 eV and about 5.2 eV) include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Such gate structures and the techniques for forming them are well known in the art and, thus, the details thereof have been omitted from this specification in order to allow the reader to focus on the salient aspects of the disclosed embodiments.

Again, as mentioned above, fin-type semiconductor devices formed according to the disclosed method and incorporated into the disclosed semiconductor structure 200 can be single-fin or multi-fin FINFETs (as illustrated and described in detail above). Alternatively, such fin-type semiconductor devices could be any other type of device that incorporates one or more semiconductor fin including, but are not limited to, resistors, BJTs, HBTs, etc.

The method embodiments described above can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Additionally, in the structure and method embodiments described above, the terminology used is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a semiconductor substrate;
a first semiconductor fin extending from the semiconductor substrate;
a second semiconductor fin extending from the semiconductor substrate, wherein the first semiconductor fin and the second semiconductor fin are in end-to-end alignment, and
an isolation region on the semiconductor substrate positioned laterally between adjacent ends of the first semiconductor fin and the second semiconductor fin,
wherein the isolation region includes at least one first isolation structure having a first height and a second isolation structure having a second height that is greater than the first height,
wherein the second isolation structure is in contact with the adjacent ends of the first semiconductor fin and the second semiconductor fin, and
wherein the first isolation structure is positioned laterally between and immediately adjacent to sections of the second isolation structure.

2. The structure of claim 1,
wherein the semiconductor substrate has bottom surface,
wherein the first isolation structure has a first bottom immediately adjacent to the semiconductor substrate and a first top opposite the first bottom and the first height is measurable from the first bottom to the first top,
wherein the second isolation structure has a second bottom immediately adjacent to the semiconductor substrate and a second top opposite the second bottom and the second height is measurable from the second bottom to the second top, and
wherein the first bottom of the first isolation structure is separated from the bottom surface of the semiconductor substrate by a greater distance than the second bottom of the second isolation structure.

3. The structure of claim 1, wherein the first isolation structure includes a first isolation material and wherein the second isolation structure includes a second isolation material that is different from the first isolation material.

4. The structure of claim 3, wherein the first isolation material and the second isolation material have any of the following differences:
the first isolation material and the second isolation material are different oxide materials, and
the first isolation material and the second isolation material have different carbon concentrations.

5. The structure of claim 1, wherein the isolation region includes, between the first semiconductor fin and the second semiconductor fin, alternating first isolation structures having the first height and sections of the second isolation structure having the second height.

6. The structure of claim 1, wherein the first isolation structure is surrounded on four sides by the second isolation structure.

7. The structure of claim 1, wherein the first isolation structure is positioned laterally adjacent to a sidewall of a third semiconductor fin.

8. A structure comprising:
a semiconductor substrate;
a device including a first semiconductor fin extending from the semiconductor substrate;
a second semiconductor fin extending from the semiconductor substrate, wherein the first semiconductor fin and the second semiconductor fin are in end-to-end alignment; and
an isolation region on the semiconductor substrate positioned laterally between adjacent ends of the first semiconductor fin and the second semiconductor fin,
wherein the isolation region includes a first isolation structure having a first height and a second isolation structure having a second height that is greater than the first height,
wherein the second isolation structure is in contact with the adjacent ends of the first semiconductor fin and the second semiconductor fin, and
wherein the first isolation structure is positioned laterally between and immediately adjacent to sections of the second isolation structure.

9. The structure of claim 8, wherein the device comprises a single-fin fin-type field effect transistor.

10. The structure of claim 8,
wherein the semiconductor substrate has bottom surface,
wherein the first isolation structure has a first bottom immediately adjacent to the semiconductor substrate and a first top opposite the first bottom and the first height is measurable from the first bottom to the first top,
wherein the second isolation structure has a second bottom immediately adjacent to the semiconductor substrate and a second top opposite the second bottom and the second height is measurable from the second bottom to the second top, and
wherein the first bottom of the first isolation structure is separated from the bottom surface of the semiconductor substrate by a greater distance than the second bottom of the second isolation structure.

11. The structure of claim 8, wherein the first isolation structure includes a first isolation material, and wherein the second isolation structure includes a second isolation material that is different from the first isolation material.

12. The structure of claim 8, further including a second device including the second semiconductor fin.

13. The structure of claim 12, wherein the isolation region includes, between the first semiconductor fin and the second semiconductor fin, alternating first isolation structures having the first height and sections of the second isolation structure having the second height.

14. The structure of claim 8, wherein the first isolation structure is one of surrounded on four sides by the second isolation structure and positioned laterally immediately adjacent to a sidewall of a third semiconductor fin of a third device.

15. A method including:
forming a first semiconductor fin extending from a semiconductor substrate and a second semiconductor fin extending from the semiconductor substrate, wherein the first semiconductor fin and the second semiconductor fin are in end-to-end alignment; and
forming an isolation region on the semiconductor substrate positioned laterally between adjacent ends of the first semiconductor fin and the second semiconductor fin,
wherein the isolation region includes at least one first isolation structure having a first height and a second isolation structure having a second height that is greater than the first height,
wherein the second isolation structure is in contact with the adjacent ends of the first semiconductor fin and the second semiconductor fin, and
wherein the first isolation structure is positioned laterally between and immediately adjacent to sections of the second isolation structure.

16. The method of claim 15, further comprising
forming multiple semiconductor fins including the first semiconductor fin and the second semiconductor fin, wherein the forming of the isolation region includes:
filling spaces above the semiconductor substrate and between the multiple semiconductor fins with a first isolation material;
forming a mask layer above the multiple semiconductor fins and the first isolation material;
forming an opening in the mask layer to define a shape of the second isolation structure;
forming a trench extending through any semiconductor fin portion and the first isolation material aligned below the opening and further extending into the semiconductor substrate below the first isolation material; and
filling the trench with a second isolation material for the second isolation structure.

17. The method of claim 16, wherein the first isolation material and the second isolation material have any of the following differences:
- the first isolation material and the second isolation material are different oxide materials, and
- the first isolation material and the second isolation material have different carbon concentrations.

18. The method of claim 15, wherein the forming of the isolation region includes forming the isolation region so that the first isolation structure is one of surrounded on four sides by the second isolation structure and positioned laterally immediately adjacent to a sidewall of a third semiconductor fin of the multiple semiconductor fins.

* * * * *